US010283731B2

(12) United States Patent
Dabich, II et al.

(10) Patent No.: US 10,283,731 B2
(45) Date of Patent: May 7, 2019

(54) LASER WELDING TRANSPARENT GLASS SHEETS USING LOW MELTING GLASS OR THIN ABSORBING FILMS

(71) Applicant: CORNING INCORPORATED, Corning, NY (US)

(72) Inventors: Leonard Charles Dabich, II, Painted Post, NY (US); Stephan Lvovich Logunov, Corning, NY (US); Mark Alejandro Quesada, Horseheads, NY (US); Alexander Mikhailovich Streltsov, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/699,337

(22) Filed: Sep. 8, 2017

(65) Prior Publication Data
US 2018/0138446 A1    May 17, 2018

Related U.S. Application Data

(60) Division of application No. 15/090,978, filed on Apr. 5, 2016, now Pat. No. 9,761,828, which is a
(Continued)

(51) Int. Cl.
*H01L 51/52* (2006.01)
*C03C 3/12* (2006.01)
(Continued)

(52) U.S. Cl.
CPC ........ *H01L 51/5246* (2013.01); *B23K 26/206* (2013.01); *B32B 7/04* (2013.01);
(Continued)

(58) Field of Classification Search
CPC ...... H01L 51/5246; C03C 4/0071; B32B 7/04
See application file for complete search history.

(56) References Cited

U.S. PATENT DOCUMENTS 5,089,446 A    2/1992 Cornelius et al.
5,272,309 A    12/1993 Goruganthu et al.
(Continued)

FOREIGN PATENT DOCUMENTS

CN    102245525 A    11/2011
EP        1117502 B1    1/2003
(Continued)

OTHER PUBLICATIONS

Adams et al; "Effects of Nonlinear Absorption in BK7 and Color Glasses at 355NM"; SPIE Boulder Damage Symposium XXXV; Sep. 22-24, 2003; 17 Pages.
(Continued)

*Primary Examiner* — Laura M Menz
(74) *Attorney, Agent, or Firm* — Ryan T. Hardee

(57) ABSTRACT

A method of sealing a workpiece comprising forming an inorganic film over a surface of a first substrate, arranging a workpiece to be protected between the first substrate and a second substrate wherein the inorganic film is in contact with the second substrate; and sealing the workpiece between the first and second substrates as a function of the composition of impurities in the first or second substrates and as a function of the composition of the inorganic film by locally heating the inorganic film with a predetermined laser radiation wavelength. The inorganic film, the first substrate, or the second substrate can be transmissive at approximately 420 nm to approximately 750 nm.

20 Claims, 30 Drawing Sheets

Related U.S. Application Data continuation of application No. 14/271,797, filed on May 7, 2014, now Pat. No. 9,515,286.

(60) Provisional application No. 61/822,048, filed on May 10, 2013, provisional application No. 61/886,928, filed on Oct. 4, 2013, provisional application No. 61/829,379, filed on May 31, 2013.

(51) Int. Cl.

| | | |
|---|---|---|
| *C03C 23/00* | (2006.01) | |
| *C03C 27/06* | (2006.01) | |
| *C03C 27/08* | (2006.01) | |
| *C03B 23/203* | (2006.01) | |
| *B23K 26/20* | (2014.01) | |
| *B32B 37/06* | (2006.01) | |
| *H01L 51/00* | (2006.01) | |
| *B32B 7/04* | (2019.01) | |
| *B32B 17/06* | (2006.01) | |
| *C03C 3/14* | (2006.01) | |
| *C03C 3/16* | (2006.01) | |
| *C03C 3/23* | (2006.01) | |
| *C03C 3/247* | (2006.01) | |
| *C03C 4/00* | (2006.01) | |
| *C03C 8/24* | (2006.01) | |

(52) U.S. Cl.
CPC .............. *B32B 17/06* (2013.01); *B32B 37/06* (2013.01); *C03B 23/203* (2013.01); *C03C 3/12* (2013.01); *C03C 3/14* (2013.01); *C03C 3/16* (2013.01); *C03C 3/23* (2013.01); *C03C 3/247* (2013.01); *C03C 4/0071* (2013.01); *C03C 8/24* (2013.01); *C03C 23/0025* (2013.01); *C03C 27/06* (2013.01); *C03C 27/08* (2013.01); *H01L 51/0024* (2013.01); *B32B 2250/03* (2013.01); *B32B 2250/40* (2013.01); *B32B 2255/20* (2013.01); *B32B 2310/0825* (2013.01); *B32B 2310/0831* (2013.01); *B32B 2310/0843* (2013.01); *B32B 2457/206* (2013.01); *C03C 2204/00* (2013.01); *C03C 2207/00* (2013.01); *C03C 2218/32* (2013.01); *H01L 2251/301* (2013.01)

(56) References Cited

U.S. PATENT DOCUMENTS

| | | | |
|---|---|---|---|
| 5,489,321 A | 2/1996 | Tracy et al. | |
| 6,306,783 B1 | 10/2001 | Yamanaka | |
| 6,423,613 B1 | 7/2002 | Geusic | |
| 6,501,043 B1 | 12/2002 | Ruben | |
| 6,501,044 B1 | 12/2002 | Klockhaus et al. | |
| 6,717,100 B2 | 4/2004 | Ruben | |
| 6,762,072 B2 | 7/2004 | Lutz | |
| 6,818,530 B2 | 11/2004 | Shimoda et al. | |
| 6,831,029 B2 | 12/2004 | Chacon et al. | |
| 6,998,776 B2 * | 2/2006 | Aitken | C03C 3/072 313/512 |
| 7,232,595 B2 * | 6/2007 | Coykendall | C08F 255/02 428/1.5 |
| 7,256,221 B2 * | 8/2007 | Coykendall | C08F 255/02 522/14 |
| 7,344,901 B2 | 3/2008 | Hawtof et al. | |
| 7,361,573 B2 | 4/2008 | Takayama et al. | |
| 7,407,423 B2 * | 8/2008 | Aitken | C03C 3/072 445/23 |
| 7,449,773 B2 | 11/2008 | Tarn | |
| 7,602,121 B2 * | 10/2009 | Aitken | C03C 3/072 313/512 |
| 7,626,138 B2 | 12/2009 | Bovatsek et al. | |
| 7,641,976 B2 * | 1/2010 | Lamberson | C03C 1/026 313/504 |
| 7,652,305 B2 * | 1/2010 | Chatterjee | H01L 51/5246 257/40 |
| 7,723,441 B2 * | 5/2010 | Shustack | C08K 3/105 525/338 |
| 7,829,147 B2 | 11/2010 | Aitken et al. | |
| 7,872,338 B2 | 1/2011 | Tarn | |
| 8,063,560 B2 * | 11/2011 | Aitken | C03C 3/072 313/512 |
| 8,134,293 B2 | 3/2012 | Logunov et al. | |
| 8,148,179 B2 * | 4/2012 | Aitken | C03B 23/245 257/E51.026 |
| 8,198,203 B2 * | 6/2012 | Lamberson | C03C 3/21 501/46 |
| 8,314,359 B2 | 11/2012 | Bovatsek et al. | |
| 8,343,412 B2 | 1/2013 | Klein et al. | |
| 8,367,440 B2 | 2/2013 | Takayama et al. | |
| 8,375,744 B2 | 2/2013 | Becken et al. | |
| 8,389,891 B2 | 3/2013 | Bovatsek et al. | |
| 8,490,434 B2 | 7/2013 | Watanabe et al. | |
| 8,530,786 B2 | 9/2013 | Bovatsek et al. | |
| 8,563,113 B2 | 10/2013 | Edwards et al. | |
| 8,697,242 B2 | 4/2014 | Kawanami et al. | |
| 8,778,121 B2 | 7/2014 | Tuennermann et al. | |
| 8,778,469 B2 | 7/2014 | Kawanami et al. | |
| 8,796,109 B2 | 8/2014 | Ruben et al. | |
| 8,975,159 B2 | 3/2015 | Akiyama | |
| 9,021,836 B2 | 5/2015 | Matsumoto | |
| 9,023,744 B2 | 5/2015 | Kawaguchi | |
| 9,090,498 B2 | 7/2015 | Masuda et al. | |
| 9,093,668 B2 | 7/2015 | Han | |
| 9,120,287 B2 | 9/2015 | Ruben et al. | |
| 9,171,721 B2 | 10/2015 | Danzl et al. | |
| 9,515,286 B2 * | 12/2016 | Dabich, II | B23K 26/206 |
| 9,666,763 B2 * | 5/2017 | Logunov | C03C 3/247 |
| 2002/0128141 A1 | 9/2002 | Buhrmaster et al. | |
| 2004/0082145 A1 | 4/2004 | Reichenbach et al. | |
| 2004/0206953 A1 | 10/2004 | Morena et al. | |
| 2004/0207314 A1 | 10/2004 | Aitken | |
| 2004/0256367 A1 | 12/2004 | Ruben | |
| 2005/0116245 A1 | 6/2005 | Aitken et al. | |
| 2005/0199599 A1 | 9/2005 | Li et al. | |
| 2007/0040501 A1 | 2/2007 | Aitken et al. | |
| 2008/0106194 A1 | 5/2008 | Logunov et al. | |
| 2008/0146431 A1 | 6/2008 | Aitken et al. | |
| 2008/0164467 A1 * | 7/2008 | Sano | H01L 33/0079 257/43 |
| 2009/0069164 A1 * | 3/2009 | Lamberson | C03C 1/026 501/15 |
| 2010/0142576 A1 * | 6/2010 | Cohen | B82Y 20/00 372/45.01 |
| 2011/0209813 A1 | 9/2011 | Shibuya et al. | |
| 2011/0223360 A1 | 9/2011 | Shibuya et al. | |
| 2012/0070618 A1 | 3/2012 | Sakamoto et al. | |
| 2012/0147538 A1 * | 6/2012 | Kawanami | C03C 8/04 361/679.01 |
| 2012/0240632 A1 | 9/2012 | Matsumoto | |
| 2012/0325789 A1 | 12/2012 | Masuda et al. | |
| 2013/0095260 A1 | 4/2013 | Bovatsek et al. | |
| 2013/0112650 A1 | 5/2013 | Karam et al. | |
| 2013/0125516 A1 | 5/2013 | Bayne et al. | |
| 2013/0164486 A1 | 6/2013 | Yamada et al. | |
| 2013/0183474 A1 | 7/2013 | Bovatsek et al. | |
| 2013/0223922 A1 | 8/2013 | Koval et al. | |
| 2013/0244859 A1 | 9/2013 | Kawaguchi et al. | |
| 2014/0004318 A1 | 1/2014 | Bovatsek et al. | |
| 2014/0087099 A1 | 3/2014 | Veerasamy et al. | |
| 2014/0151742 A1 * | 6/2014 | Logunov | C03C 3/247 257/99 |
| 2014/0242306 A1 * | 8/2014 | Koval | C03B 23/245 428/34 |
| 2015/0027168 A1 * | 1/2015 | Dabich, II | B23K 26/206 65/41 |
| 2015/0064478 A1 * | 3/2015 | Drake | B32B 17/06 428/427 |
| 2015/0315427 A1 * | 11/2015 | Yoshida | H01L 21/56 257/791 |

(56) References Cited

U.S. PATENT DOCUMENTS

| | | | |
|---|---|---|---|
| 2016/0084476 A1* | 3/2016 | Koole | C09K 11/02 |
| | | | 362/84 |
| 2016/0268541 A1* | 9/2016 | Dabich, II | B23K 26/206 |
| 2016/0289111 A1* | 10/2016 | Dabich, II | B23K 26/206 |
| 2017/0047542 A1* | 2/2017 | Dejneka | C04B 37/001 |

FOREIGN PATENT DOCUMENTS

| | | | | |
|---|---|---|---|---|
| EP | 2351717 | A1 | 8/2011 | |
| WO | 1996002473 | A1 | 2/1996 | |
| WO | 2001030530 | A1 | 5/2001 | |
| WO | 2011158873 | A1 | 12/2011 | |
| WO | 2013070791 | A1 | 5/2013 | |
| WO | 2013130374 | A1 | 9/2013 | |
| WO | 2014052178 | A1 | 4/2014 | |
| WO | 2014085427 | A1 | 6/2014 | |
| WO | 2014182776 | A1 | 11/2014 | |
| WO | WO-2014182776 | A1 * | 11/2014 | B23K 26/206 |

OTHER PUBLICATIONS

Graham et al; "Corning and the Craft of Innovation"; Oxford University Press; 2001; 11 Pages.

International Search Report and Written Opinion of the International Searching Authority; PCT/US2014/037086; dated Aug. 18, 2014; 11 Pages; European Patent Office.

Kadhim et al; "Effects of the Diffusion Bonding Conditions on Joints Strength"; Journal of Engineering and Development, vol. 13, No. 1; Mar. 2009; 10 Pages.

Logunov et al; "Laser-Induced Swelling of Transparent Glasses"; Applied Surface Science; 257 (2011) 8883-8886.

Olguin et al; "Temperature and Isotopic Mass Dependence of the Direct Band Gap in Semiconductors: LCAO Calculations"; Phys. Stat. Sol. (B) 220, 33 (2002) pp. 33-39.

Saito et al; "Development of a Wide-Temperature Range VUV and UV Spectrophotometer and its Applications to Silica Glass"; Journal of Non-Crystalline Solids; 259 (1999) 81-86.

\* cited by examiner

ITO

LASER WELDING TRANSPARENT GLASS SHEETS USING LOW MELTING GLASS OR THIN ABSORBING FILMS

CROSS REFERENCES

This application is a divisional application and claims the benefit of priority under 35 U.S.C. § 120 of U.S. application Ser. No. 15/090,978, filed Apr. 5, 2016, and is a continuation of U.S. Pat. No. 9,515,286, granted Dec. 6, 2016 which claims the priority benefit of U.S. Provisional Application No. 61/822,048, filed May 10, 2013 and entitled, "Laser Welding Transparent Glass Sheet Using Low Melting Glass Film," U.S. Provisional Application No. 61/886,928, filed Oct. 4, 2013 and entitled "Laser Welding Transparent Glass Sheets Using Ultraviolet Absorbing Film," and U.S. Provisional Application No. 61/829,379, filed May 31, 2013 and entitled "Laser Sealing Using Low Melting Temperature Glass for Hermetic Devices," the entirety of each being incorporated herein by reference.

BACKGROUND

Many modern devices require hermetic environments to operate and many amongst these are "active" devices which require electrical biasing. Displays such as organic light emitting diodes (OLED) that require light transparency and biasing are demanding applications due to their need for absolute hermeticity as a result of the use of electron-injection materials. These materials would generally decompose at atmosphere within seconds otherwise, so the respective device should maintain vacuum or inert atmospheres for long periods of time. Furthermore, the hermetic sealing should be performed near ambient temperatures due to high temperature sensitivity of the organic material to be encapsulated.

Frit-based sealants, for instance, include glass materials ground to a particle size ranging typically from about 2 to 150 microns. For fit-sealing applications, the glass frit material is typically mixed with a negative CTE material having a similar particle size, and the resulting mixture is blended into a paste using an organic solvent or binder. Exemplary negative CTE inorganic fillers include cordierite particles (e.g. $Mg_2Al_3[AlSi_5O_{18}]$), barium silicates, β-eucryptite, zirconium vanadate ($ZrV_2O_7$), or zirconium tungstate, ($ZrW_2O_8$) and are added to the glass frit, forming a paste, to lower the mismatch of thermal expansion coefficients between substrates and the glass frit. The solvents are used to adjust the rheological viscosity of the combined powders and organic binder paste and must be suitable for controlled dispensing purposes. To join two substrates, a glass frit layer can be applied to sealing surfaces on one or both of the substrates by spin-coating or screen printing. The frit-coated substrate(s) are initially subjected to an organic burn-out step at relatively low temperature (e.g., 250° C. for 30 minutes) to remove the organic vehicle. Two substrates to be joined are then assembled/mated along respective sealing surfaces and the pair is placed in a wafer bonder. A thermo-compressive cycle is executed under well-defined temperature and pressure whereby the glass frit is melted to form a compact glass seal. Glass frit materials, with the exception of certain lead-containing compositions, typically have a glass transition temperature greater than 450° C. and thus require processing at elevated temperatures to form the barrier layer. Such a high-temperature sealing process can be detrimental to temperature-sensitive workpieces. Further, the negative CTE inorganic fillers, which are used in order to lower the thermal expansion coefficient mismatch between typical substrates and the glass frit, will be incorporated into the bonding joint and result in a frit-based barrier layer that is substantially opaque. Based on the foregoing, it would be desirable to form glass-to-glass, glass-to-metal, glass-to-ceramic, and other seals at low temperatures that are transparent and hermetic.

While conventional laser welding of glass substrates can employ ultra-high laser power devices, this operation at near laser ablation often times damages the glass substrates and achieves a poor quality hermetic seal. Again, such conventional methods increase the opacity of the resulting device and also provide a low quality seal.

SUMMARY

Embodiments of the present disclosure are generally directed to hermetic barrier layers, and more particularly to methods and compositions used to seal solid structures using absorbing thin films. Embodiments of the present disclosure provide a laser welding or sealing process of a glass sheet with other material sheets using a thin film with absorptive properties during sealing process as an interfacial initiator. Exemplary laser-welding conditions according to embodiments can be suitable for welding over interfacial conductive films with negligible reduction in the conductivity. Such embodiments may thus be employed to form hermetic packages of active devices such as OLEDs or other devices and enable widespread, large-volume fabrication of suitable glass or semiconductor packages. It should be noted that the terms sealing, joining, bonding, and welding can be and are used interchangeably in the instant disclosure. Such use should not limit the scope of the claims appended herewith. It should also be noted that the terms glass and inorganic as they relate to the modification of the noun film can be used interchangeably in this instant disclosure, and such use should not limit the scope of the claims appended herewith.

Embodiments of the present disclosure provide a laser sealing process, e.g., laser welding, diffusing welding, etc., that can provide an absorptive film at the interface between two glasses. The absorption in steady state may be greater than or as high as about 70% or may be less than or as low as about 10%. The latter relies upon color center formation within the glass substrates due to extrinsic color centers, e.g., impurities or dopants, or intrinsic color centers inherent to the glass, at an incident laser wavelength, combined with exemplary laser absorbing films. Some non-limiting examples of films include $SnO_2$, $ZnO$, $TiO_2$, ITO, UV absorbing glass films with Tg<600° C., and low melting glass (LMG), or low liquidus temperature (LLT) films (for materials without a glass transition temperature) which can be employed at the interface of the glass substrates. LLT materials may include, but are not limited to, ceramic, glass-ceramic, and glass materials to name a few. LLT glass, for example, can include tin-fluorophosphate glass, tungsten-doped tin fluorophosphate glass, chalcogenide glass, tellurite glass, borate glass and phosphate glass. In another non-limiting embodiment, the sealing material can be a $Sn^{2+}$ containing inorganic oxide material such as, for example, SnO, $SnO+P_2O_5$ and $SnO+BPO_4$. Additional non-limiting examples may include near infrared (NIR) absorbing glass films with absorption peaks at wavelength >800 nm. Welds using these materials can provide visible transmission with sufficient UV or NIR absorption to initiate steady state gentle diffusion welding. These materials can also provide transparent laser welds having localized sealing temperatures suitable for diffusion welding. Such diffusion welding results in low power and temperature laser welding of the respective glass substrates and can produce superior transparent welds with efficient and fast welding speeds. Exemplary laser welding processes according to embodiments of the present disclosure can also rely upon photo-induced absorption properties of glass beyond color center formation to include temperature induced absorption.

The phenomenon of welding transparent glass sheets together with a laser using an interfacial thin film of low melting inorganic (LMG) material or ultraviolet absorbing (UVA) or infrared absorbing (IRA) material to initiate sealing is described herein. In exemplary embodiments, three criteria are described for realizing strong bond formation: (1) exemplary LMG or UVA or IRA films can absorb at an incident wavelength outside of window of transparency (from about 420 nm to about 750 nm) sufficient to propagate sufficient heat into the glass substrate, and the glass substrate can thus exhibit (2) temperature-induced-absorption and (3) transient color-center formation at the incident wavelength. Measurements suggest that a thermo-compressive diffusion welding mechanism is formed, qualitatively resulting in a very strong bond formation. The unfolding of temperature events related to the welding process and clear prevalence of color center formation processes in laser welding are also described herein. CTE-mismatch irrelevance between the LMG or UVA material and Eagle XG® materials and post-weld strength enhancement after thermal cycling to 600° C. are also discussed. Embodiments are also discussed regarding the welding of glass sheets together that have different thicknesses by using thermally conductive plates. Embodiments described herein can thus provide an ability to form hermetic packages, with both passive and active devices, that can include laser sealing attributes associated with using LMG or UVA interfacial materials. Exemplary attributes include, but are not limited to, transparent, strong, thin, high transmission in the visible spectrum, "green" composition, CTE-mismatch irrelevance between LMG or UVA films and glass substrates, and low melting temperatures.

Additional embodiments of the present disclosure provide a laser sealing process having a low temperature bond formation and "direct glass sealing" where the transparent glass can be sealed to absorbing glass at the incident wavelength resulting in an opaque seal at visible wavelengths 400-700 nm. With exemplary embodiments, both glasses are transparent or almost transparent at incident laser wavelengths, and in the visible wavelength range. The resulting seal is also transparent in the visible wavelength range making it attractive for lighting applications as no light is absorbed at the seal location, and thus, no heat build-up is associated with the seal. In addition, since the film can be applied over the entire cover glass, there is no need to precision dispense sealing frit paste for the sealing operation thereby providing device manufacturers large degrees of freedom for changing their sealing pattern without need for special patterning and processing of the sealing area. In other embodiments, sealing can also be performed on certain spots of the glass area to form non-hermetic bonding for mechanical stability. Furthermore, such sealing can be performed on curved conformal surfaces.

Embodiments of the present disclosure provide low melting temperature materials which may be used to laser-weld glass sheet together that involve welding any glass without regard to the differing CTEs of the glass. Additional embodiments can provide symmetric welding (i.e., thick-to-thick) of glass substrates, e.g., Eagle-to-Eagle, Lotus-to-Lotus, etc. Some embodiments can provide asymmetric welding (i.e., thin-to-thick) of glass substrates, e.g., Willow-to-Eagle XG®, Eagle-to-Lotus (i.e., thin-to-thin), Eagle-to-Fused Silica, Willow-to-Willow, fused silica-fused silica, etc. using thermally conductive plates. Further embodiments can provide disparate substrate welding (glass to ceramic, glass to metal, etc.) and can provide transparent and/or translucent weld lines. Some embodiments can provide welding for thin, impermeable, "green", materials and can provide strong welds between two substrates or materials having large differences in CTEs.

Embodiments also provide materials used to laser weld glass packages together thereby enabling long lived hermetic operation of passive and active devices sensitive to degradation by attack of oxygen and moisture. Exemplary LMG or other thin absorbing film seals can be thermally activated after assembly of the bonding surfaces using laser absorption and can enjoy higher manufacturing efficiency since the rate of sealing each working device is determined by thermal activation and bond formation rather than the rate one encapsulates a device by inline thin film deposition in a vacuum or inert gas assembly line. Exemplary LMG, LLT and other thin absorbing films in UV or NIR-IR seals can also enable large sheet multiple device sealing with subsequent scoring or dicing into individual devices (singulation), and due to high mechanical integrity, the yield from singulation can be high.

In some embodiments, a method of bonding a workpiece comprises forming an inorganic film over a surface of a first substrate, arranging a workpiece to be protected between the first substrate and a second substrate wherein the film is in contact with the second substrate, and bonding the workpiece between the first and second substrates by locally heating the film with laser radiation having a predetermined wavelength. The inorganic film, the first substrate, or the second substrate can be transmissive at approximately 420 nm to approximately 750 nm.

In other embodiments, a bonded device is provided comprising an inorganic film formed over a surface of a first substrate, and a device protected between the first substrate and a second substrate wherein the inorganic film is in contact with the second substrate. In such an embodiment, the device includes a bond formed between the first and second substrates as a function of the composition of impurities in the first or second substrates and as a function of the composition of the inorganic film though a local heating of the inorganic film with laser radiation having a predetermined wavelength. Further, the inorganic film, the first substrate, or the second substrate can be transmissive at approximately 420 nm to approximately 750 nm.

In further embodiments, a method of protecting a device is provided comprising forming an inorganic film layer over a first portion surface of a first substrate, arranging a device to be protected between the first substrate and a second substrate wherein the sealing layer is in contact with the second substrate, and locally heating the inorganic film layer and the first and second substrates with laser radiation to melt the sealing layer and the substrates to form a seal between the substrates. The first substrate can be comprised of glass or glass-ceramics, and the second substrate can be comprised of glass, metal, glass-ceramics or ceramic.

Additional features and advantages of the claimed subject matter will be set forth in the detailed description which follows, and in part will be readily apparent to those skilled in the art from that description or recognized by practicing the claimed subject matter as described herein, including the detailed description which follows, the claims, as well as the appended drawings.

It is to be understood that both the foregoing general description and the following detailed description present embodiments of the present disclosure, and are intended to provide an overview or framework for understanding the nature and character of the claimed subject matter. The accompanying drawings are included to provide a further understanding of the present disclosure, and are incorporated into and constitute a part of this specification. The drawings illustrate various embodiments and together with the description serve to explain the principles and operations of the claimed subject matter.

BRIEF DESCRIPTION OF THE DRAWINGS

These figures are provided for the purposes of illustration, it being understood that the embodiments disclosed and discussed herein are not limited to the arrangements and instrumentalities shown.

While this description can include specifics, these should not be construed as limitations on the scope, but rather as descriptions of features that can be specific to particular embodiments.

DETAILED DESCRIPTION

Various embodiments for luminescent coatings and devices are described with reference to the figures, where like elements have been given like numerical designations to facilitate an understanding.

It also is understood that, unless otherwise specified, terms such as "top," "bottom," "outward," "inward," and the like are words of convenience and are not to be construed as limiting terms. In addition, whenever a group is described as comprising at least one of a group of elements and combinations thereof, the group can comprise, consist essentially of, or consist of any number of those elements recited, either individually or in combination with each other.

Similarly, whenever a group is described as consisting of at least one of a group of elements or combinations thereof, the group can consist of any number of those elements recited, either individually or in combination with each other. Unless otherwise specified, a range of values, when recited, includes both the upper and lower limits of the range. As used herein, the indefinite articles "a," and "an," and the corresponding definite article "the" mean "at least one" or "one or more," unless otherwise specified Those skilled in the art will recognize that many changes can be made to the embodiments described while still obtaining the beneficial results of the invention. It also will be apparent that some of the desired benefits of the present disclosure can be obtained by selecting some of the described features without using other features. Accordingly, those of ordinary skill in the art will recognize that many modifications and adaptations are possible and can even be desirable in certain circumstances and are part of the invention. Thus, the following description is provided as illustrative of the principles of the present disclosure and not in limitation thereof.

Those skilled in the art will appreciate that many modifications to the exemplary embodiments described herein are possible without departing from the spirit and scope of the invention. Thus, the description is not intended and should not be construed to be limited to the examples given but should be granted the full breadth of protection afforded by the appended claims and equivalents thereto. In addition, it is possible to use some of the features of the present disclosure without the corresponding use of other features. Accordingly, the foregoing description of exemplary or illustrative embodiments is provided for the purpose of illustrating the principles of the present disclosure and not in limitation thereof and can include modification thereto and permutations thereof.

Figure 1:
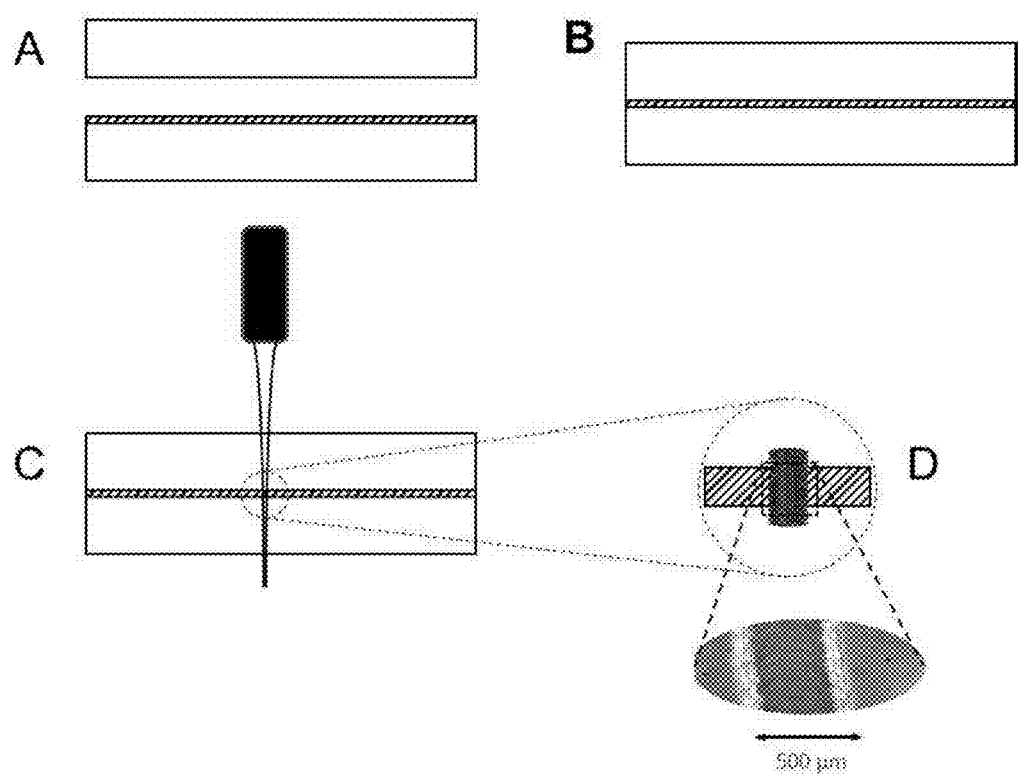
FIG. 1 is a diagram of an exemplary procedure for laser welding according to an embodiment of the present disclosure.

FIG. 1 is a diagram of an exemplary procedure for laser welding according to some embodiments of the present disclosure. With reference to FIG. 1, a procedure is provided for laser welding of two Eagle XG® (EXG) glass sheets or substrates together using a suitable UV laser. While two EXG glass sheets are illustrated and described, the claims appended herewith should not be so limited as any type and composition of glass substrates can laser welded using embodiments of the present disclosure. That is, methods as described herein are applicable to soda lime glasses, strengthened and unstrengthened glasses, aluminosilicate glasses, etc. With continued reference to FIG. 1, a sequence of exemplary steps in laser-welding two glass substrates together is provided whereby one substrate can be coated with a low melting glass (LMG) or ultraviolet absorbing (UVA) film material or MR absorbing (IRA) film material. In steps A to B, a top glass substrate can be pressed onto another substrate coated with an exemplary UVA, IRA or LMG film. It should be noted that many experiments and examples described herein may refer to a particular type of inorganic film (e.g., LMG, UVA, etc.). This, however, should not limit the scope of the claims appended herewith as many types of inorganic films are suitable for the welding processes described. In step C, a laser can be directed at an interface of the two glass sheets with suitably chosen parameters to initiate a welding process as illustrated in step D. The weld dimension was found to be slightly less than the dimensions of the incident beam (approximately 500 µm).

Figure 2:
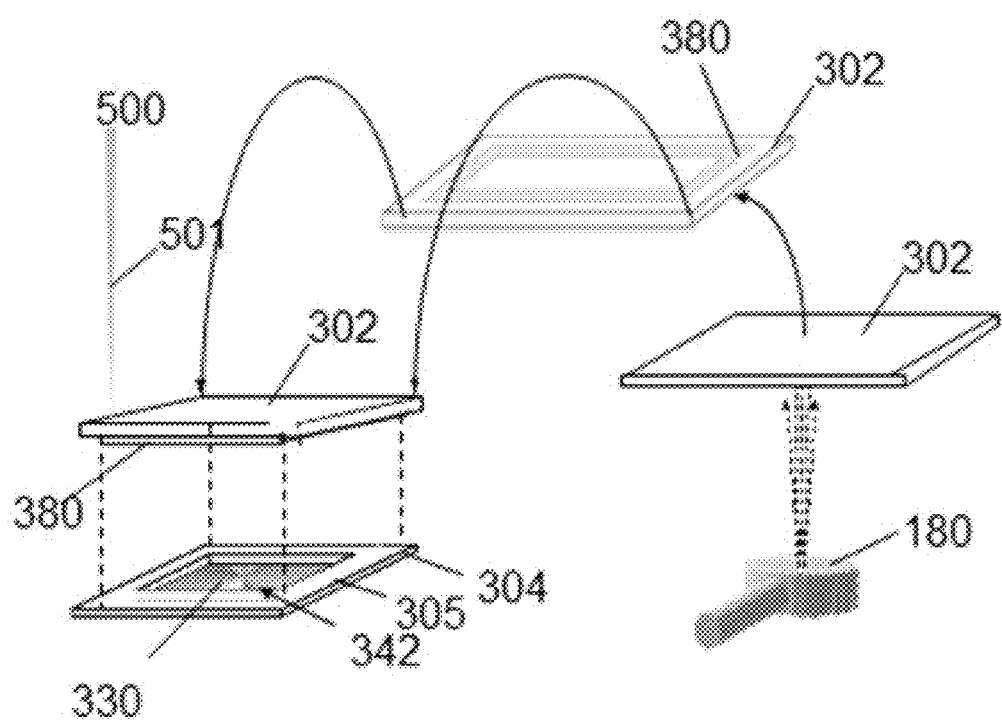
FIG. 2 is a schematic diagram illustrating the formation of a hermetically-sealed device via laser-sealing according to one embodiment.

FIG. 2 is a schematic diagram illustrating the formation of a hermetically-sealed device via laser-sealing according to one embodiment. With reference to FIG. 2, in an initial step, a patterned glass layer 380 comprising a low melting temperature (e.g., low $T_g$) glass can be formed along a sealing surface of a first planar glass substrate 302. The glass layer 380 can be deposited via physical vapor deposition, for example, by sputtering from a sputtering target 180. In one embodiment, the glass layer can be formed along a peripheral sealing surface adapted to engage with a sealing surface of a second glass or other material substrate 304. In the illustrated embodiment, the first and second substrates, when brought into a mating configuration, cooperate with the glass layer to define an interior volume 342 that contains a workpiece 330 to be protected. In the illustrated example, which shows an exploded image of the assembly, the second substrate comprises a recessed portion within which a workpiece 330 is situated.

A focused laser beam 501 from a laser 500 can be used to locally melt the low melting temperature glass and adjacent glass substrate material to form a sealed interface. In one approach, the laser can be focused through the first substrate 302 and then translated (scanned) across the sealing surface to locally heat the glass sealing material. To affect local melting of the glass layer, the glass layer can preferably be absorbing at the laser processing wavelength. The glass substrates can be initially transparent (e.g., at least 50%, 70%, 80% or 90% transparent) at the laser processing wavelength.

In an alternate embodiment, in lieu of forming a patterned glass layer, a blanket layer of sealing (low melting temperature) glass can be formed over substantially all of a surface of a first substrate. An assembled structure comprising the first substrate/sealing glass layer/second substrate can be assembled as above, and a laser can be used to locally-define the sealing interface between the two substrates.

The laser 500 can have any suitable output to affect sealing. An exemplary laser can be a UV laser such as, but not limited to, a 355 nm laser, which lies in the range of transparency for common display glasses. A suitable laser power can range from about 1 W to about 10 W. The width of the sealed region, which can be proportional to the laser spot size, can be about 0.06 to 2 mm, e.g., 0.06, 0.1, 0.2, 0.5, 1, 1.5 or 2 mm. A translation rate of the laser (i.e., sealing rate) can range from about 1 mm/sec to 400 mm/sec or even to 1 m/sec or greater, such as 1, 2, 5, 10, 20, 50, 100, 200, or 400 mm/sec, 600 mm/sec, 800 mm/sec, 1 m/sec. The laser spot size (diameter) can be about 0.02 to 2 mm.

Suitable glass substrates exhibit significant induced absorption during sealing. In some embodiments, the first substrate 302 can be a transparent glass plate like those manufactured and marketed by Corning Incorporated under the brand names of Eagle 2000® or other glass. Alternatively, the first substrate 302 can be any transparent glass plate such as those manufactured and marketed by Asahi Glass Co. (e.g., AN100 glass), Nippon Electric Glass Co., (e.g., OA-10 glass or OA-21 glass), or Corning Precision Materials. The second substrate 304 can be the same glass material as the first glass substrate, or second substrate 304 can be a non-transparent substrate such as, but not limited to, a ceramic substrate or a metal substrate. Exemplary glass substrates can have a coefficient of thermal expansion of less than about $150 \times 10^{-7}$/° C., e.g., less than $50 \times 10^{-7}$, $20 \times 10^{-7}$ or $10 \times 10^{-7}$/° C. Of course, in other embodiments the first substrate 302 can be a ceramic, ITO, metal or other material substrate, patterned or continuous.

Figure 3:
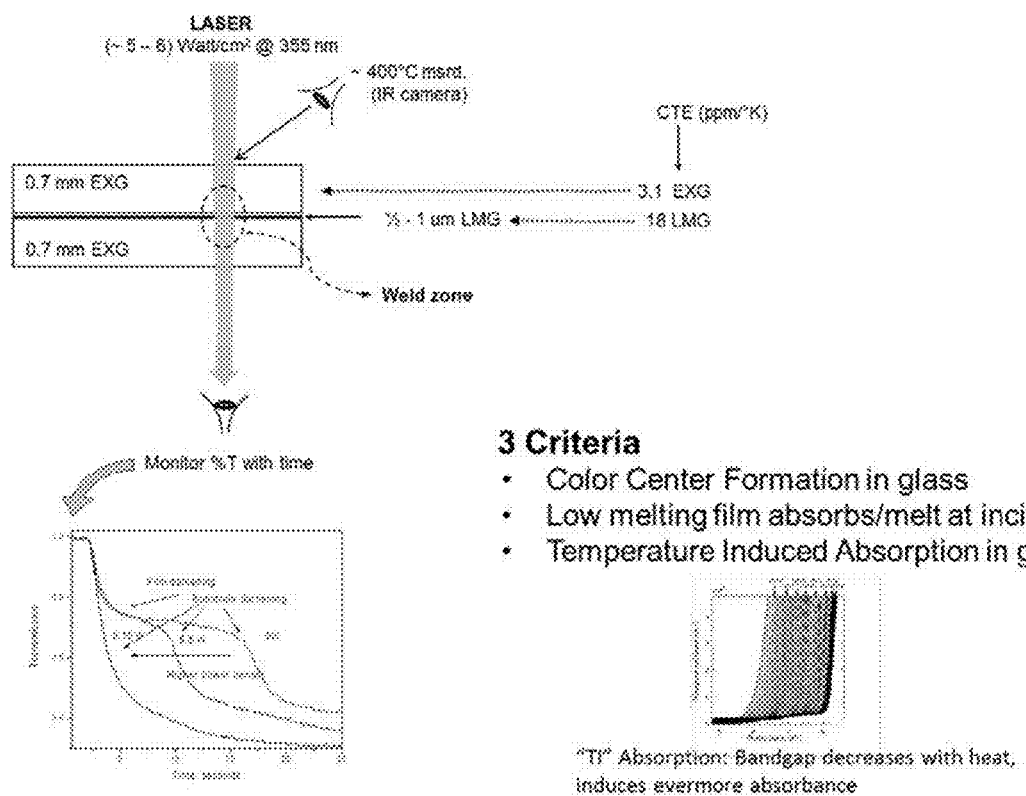
FIG. 3 is a diagram of another embodiment of the present subject matter.

FIG. 3 is a diagram of another embodiment of the present subject matter. With reference to FIG. 3, the upper left diagram illustrates some exemplary parameters that can be employed to laser weld two Eagle XG® (EXG) glass substrates. The transmission, % T, can be monitored over time and is illustrated in the lower left graph for three different laser powers. The onset of melting of the LMG, IRA or UVA film can be readily observed in the lower laser power curves (rightmost curves) as a "knee" like inflection followed by rapid absorption and heating of the glass substrate, due to high local glass temperatures exceeding Eagle XG®'s strain point. The inflection can be removed at higher laser powers (leftmost curve) and can induce a seamless transition from LMG, IRA or UVA absorption to glass fusion. Exemplary laser welding can include sweeping this zone along the interfacial boundaries to be bonded. Three criteria are described in the list shown in the lower right corner and in greater detail below, e.g., low melting film absorbs/melts at an incident wavelength, color center formation in the glass, and/or temperature induced absorption in the glass in some embodiments. The absorption of the film may be sufficient alone without effect of color center formation or even temperature absorption effect. It should be noted that the order of events identified in FIG. 3 should not limit the scope of the claims appended herewith or be indicative of relative importance to the other listed events.

In some embodiments, the initiating event can be the UV laser absorption by the low melting glass (e.g., LMG or UVA) film. This can be based upon the larger absorbance of the thin film compared to Eagle XG® at 355 nm and the melting curves depicted in FIG. 3. Considering the experimental arrangement illustrated in the top left portion of FIG. 3, the laser was a Spectra Physics HIPPO 355 nm, generating 8-10 ns pulses at 30 kHz, up to 6.5 Watts of average power. The laser beam was focused to a 500 micron diameter beam waist, and the transmitted beam was monitored and sampled, yielding plots of the transmission percentage (% T) with time for different laser powers (5.0 W, 5.5 W, 6.0 W). These plots are shown in the lower left part of FIG. 3. The onset of melting of the UVA, IRA or LMG film can be readily observed in FIG. 3 at lower laser power (bottom and middle curves) as the knee like inflection followed by rapid absorption and heating of the glass substrate, due to high local glass temperatures, which exceed Eagle XG®'s strain point. The glass parts being welded may not be melted but are rather only softened so they become pliant when held in intimate contact with a modest applied force. This behavior can be similar to solid state diffusion bonding, particularly in the ability to form strong bonds at between 50-80% of the substrate's melting temperature. An optical cross sectional image of the solid-state bond's birefringence illustrates a distinct interface line between the two parts being welded (see, e.g., FIG. 4).

Another embodiment includes welding with a 355-nm pulsed laser, producing a train of 1 ns pulses at 1 MHz, 2 MHz or 5 MHz repetition rates. When focusing the beam on the inorganic film into a spot between 0.02 mm and 0.15 mm diameter and welding with speeds ranging from 50 mm/s to 400 mm/s, defect-free bonding lines of approximately 60 µm to approximately 200 µm were produced. Required laser powers can range from approximately 1 W to approximately 10 W.

Figure 4:
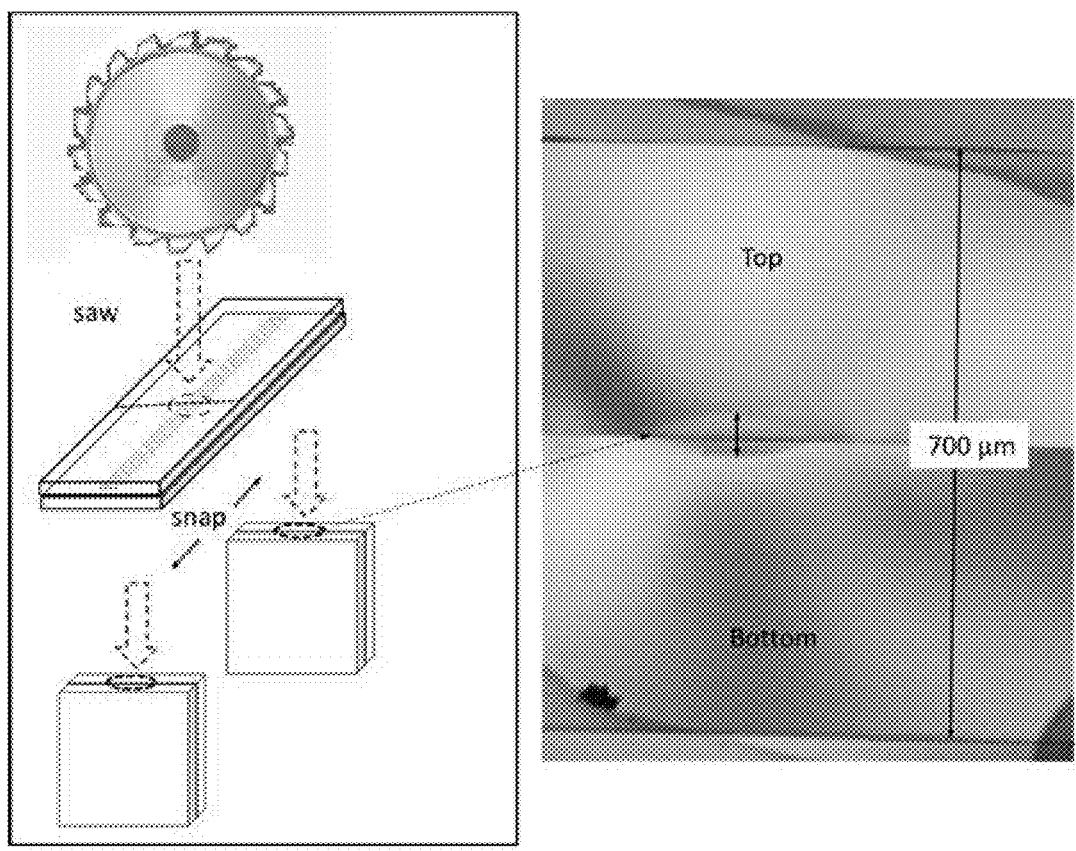
FIG. 4 is an illustration of an experimental arrangement used to estimate physical extent of a laser welding bonding zone.

With reference to FIG. 4, an experimental arrangement is illustrated which was used to estimate physical extent of laser welding bonding zone. With continued reference to FIG. 4, two Eagle XG® slides were laser welded as previously described, mounted in a glass sandwich and cut with a diamond saw. This is illustrated in the left panel of FIG. 4. The resulting cross section was mounted in a polarimeter to measure the optical birefringence resulting from local stress regions. This is shown in the right panel of FIG. 4. The lighter regions in this right panel indicate more stress. As illustrated in the right panel of FIG. 4, a bonded region appeared having a physical extent on the order 50 microns. Further, there does not appear to be any base or substrate glass melting, however, the bond formed between the two glass substrates was very strong. For example, the image in the center of the birefringence image cross section depicts a solid-state bond region extending deep (50 microns) into the Eagle XG® substrate which illustrates a high seal strength. Laser welding would include sweeping this zone along the interfacial boundaries to be bonded.

Figure 5:
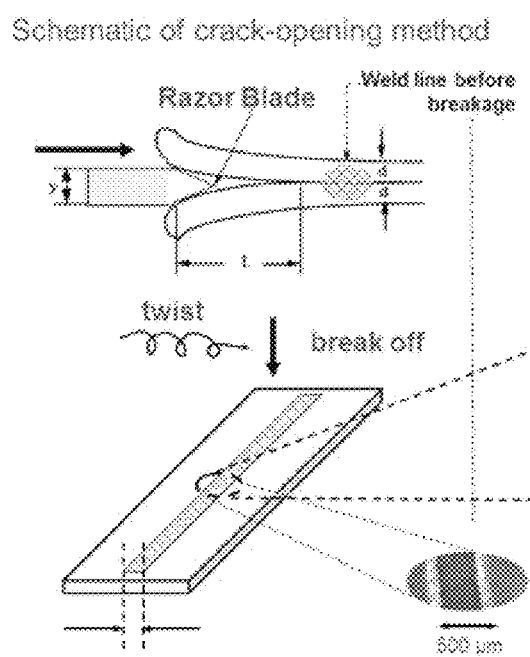
FIG. 5 is a microscopic image of fractured samples.
Figure 5:
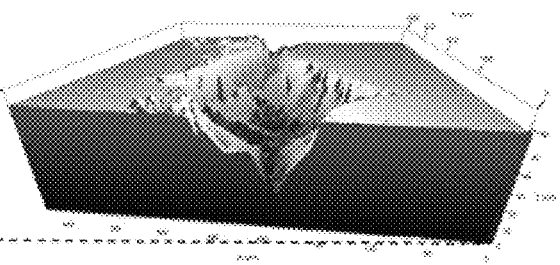

FIG. 5 is a microscopic image of fractured samples. With reference to FIG. 5, the illustrated three dimensional confocal microscopic images of fractured samples illustrate that the seal strength of embodiments of the present disclosure can be sufficiently strong such that failure occurs by ripping out the underlying substrate (e.g., Eagle XG® substrate) material as deep as 44 µm (i.e., a cohesive failure). No annealing was performed on the samples. FIG. 5 further illustrates a fractured sample of a non-annealed laser welded embodiment subjected to a razor blade crack opening technique. A series of three dimensional confocal measurements were made, and a representative example is shown on the right side of FIG. 5. One feature of these confocal images shows that the interfacial seal strength can be sufficiently strong so that failure occurs within the bulk of the substrate material, e.g., as deep as 44 µm away from the interface in this instance and in other experiments as deep as approximately 200 µm. In additional experiments, polarimetry measurements showed a residual stress occurring in the nascent laser weld (the same condition studied in FIG. 5) that was annealed at 600° C. for one hour, resulting in a tenacious bond exhibiting no measurable stress via polarimetry. Attempts at breaking such a bond resulted in breakage everywhere else except the seal line of the welded substrates.

As noted in FIG. 3, strong, hermetic, transparent bonds can be achieved using embodiments of the present disclosure by an exemplary low melting film or another film that absorbs/melts at an incident wavelength, color center formation in the film and glass, and temperature induced absorption in the film and glass. With regard to the first criterion, e.g., the low melting glass absorption event, laser illumination of the glass-LMG/UVA-glass structure with sufficiently high power per unit area can initiate absorption in the sputtered thin film LMG/UVA interface, inducing melting. This can be readily observed in the bottom curve of FIG. 3 in the lower left corner. The first downward slope of the bottom curve tracks the LMG/UVA melting process out to about 15 seconds, at which point another process occurs, this one being a glass-laser interaction (i.e., color center formation) in the respective substrate. The large curvature of this middle downward curve, after about 17 seconds would indicate a large absorption resulting from color centers forming in the glass. These color centers can generally be a function of the elemental impurity content in the substrate, e.g., As, Fe, Ga, K, Mn, Na, P, Sb, Ti, Zn, Sn to name a few. The more curvature in the transmission curve, the more color centers form. This is the second criterion noted in FIG. 3. The melting point of the LMG/UVA film can be, but is not limited to, about 450° C., but the interfacial temperature can likely be above 660° C. based upon observations of a laser illumination experiment with a surrogate aluminum-coated EXG glass substrate under similar laser welding conditions. In this experiment, the aluminum melted (melting temperature: 660° C.), and the surface temperature was measured with a calibrated thermal imaging camera (FLIR camera) to be about 250° C. using laser welding conditions.

Figure 6:
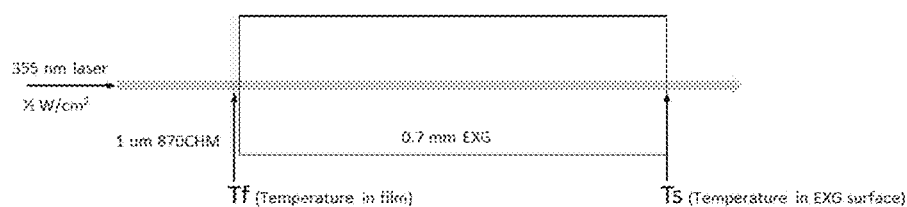
FIG. 6 is an illustration of a modeling scheme according to some embodiments of the present disclosure.
Figure 6:
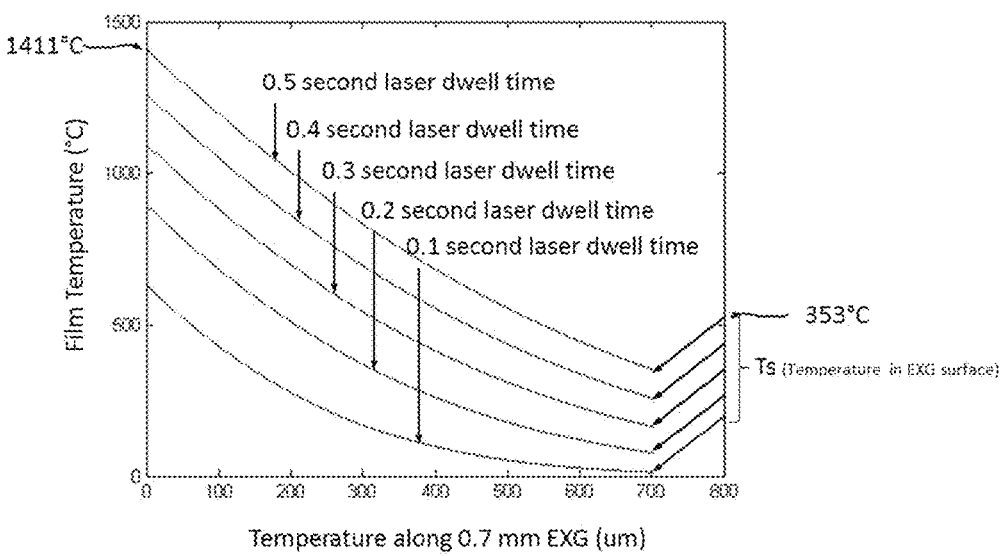

FIG. 6 is an illustration of a modeling scheme according to some embodiments of the present disclosure. With reference to FIG. 6, LMG/UVA and EXG material thermal transport properties were used to model a 355 nm laser hitting a two-layer stack comprising 1 µm thin inorganic film+700 µm EXG, at 0.8-3 kW/cm$^2$. No phase change in the thin inorganic film (e.g., LMG, IRA, UVA film, etc.) was accounted for in the model. With continued reference to FIG. 6, estimates of the instantaneous thermal distribution were made suggesting interfacial temperatures greater than 660° C. can be achieved. Regardless of the exact interfacial temperatures above 660° C. that are achieved, the presence of the hot melted LMG/UVA interfacial film increases absorption in the glass substrate by shifting energy band gap to a lower energy. These band gap shifts are generally understood to arise from the thermal expansion of the substrate lattice, related to the change of the electron energies, and the direct renormalization of band energies due to electron-photon interactions. A plot of this behavior in fused silica is shown in the lower right corner of FIG. 3. The net effect is that the hot LMG/UVA film drives more absorption in the EXG substrate near the interface by lowering the band gap which in turn generates more heat from an internal conversion processes, lowering the band gap even further. This process can be collectively referred to as thermally induced absorption which represents the third criterion identified in FIG. 3. Of course, other inorganic films can be used in such embodiments and such examples should not limit the scope of the claims appended herewith.

Figures 7, 8:
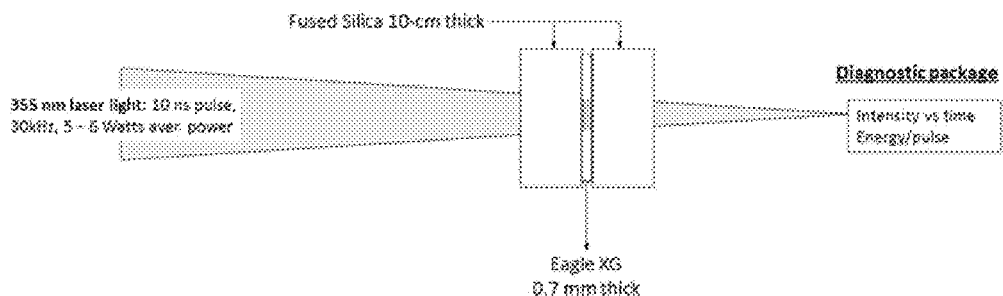
FIG. 7 is another modeling scheme according to embodiments of the present disclosure.
FIG. 8 is a diagram of an experimental arrangement for a 355 nm laser transmission (% T) through Eagle 0.7 mm glass substrate for % T versus time measurements.

As noted above, color center formation plays a role in the formation of laser welds according to embodiments of the present disclosure. Modeling the basic color center formation processes under non-multiphoton conditions to derive a fitting function based on a three level diagram is illustrated in FIG. 7 using an experimental arrangement depicted in FIG. 8. FIG. 7 is another modeling scheme according to embodiments of the present disclosure. In the left panel of FIG. 7, three electronic glass band states absorb 355 nm photons, building up, or depleting population in the ground state $n_g[t]$, the conduction band $n_e[t]$, and color centers $n_{cc}[t]$. It should be noted that single-headed arrows represent laser absorption, and double-headed arrows represent both stimulated absorption and emission. In the right panel of FIG. 7, rate equations are provided which predict the smooth monotonic build up and depletion of electronic level populations while the coherently driven parts of the system exhibit rapid oscillations of the same populations ($n_g \leftrightarrow n_e$). The initial conditions of the three levels are provided in the bottom row of the right panel of FIG. 7. FIG. 8 is a diagram of an experimental arrangement for a 355 nm laser transmission (% T) through an Eagle 0.7 mm glass substrate for % T versus time measurements. With reference to FIG. 8, diagnostic packaging can measure integrated energy and temporal waveform of UV pulses after passing through a fused silica window and Eagle XG® glass sheet with approximately 5 to 6 W being the average power.

Figure 9:
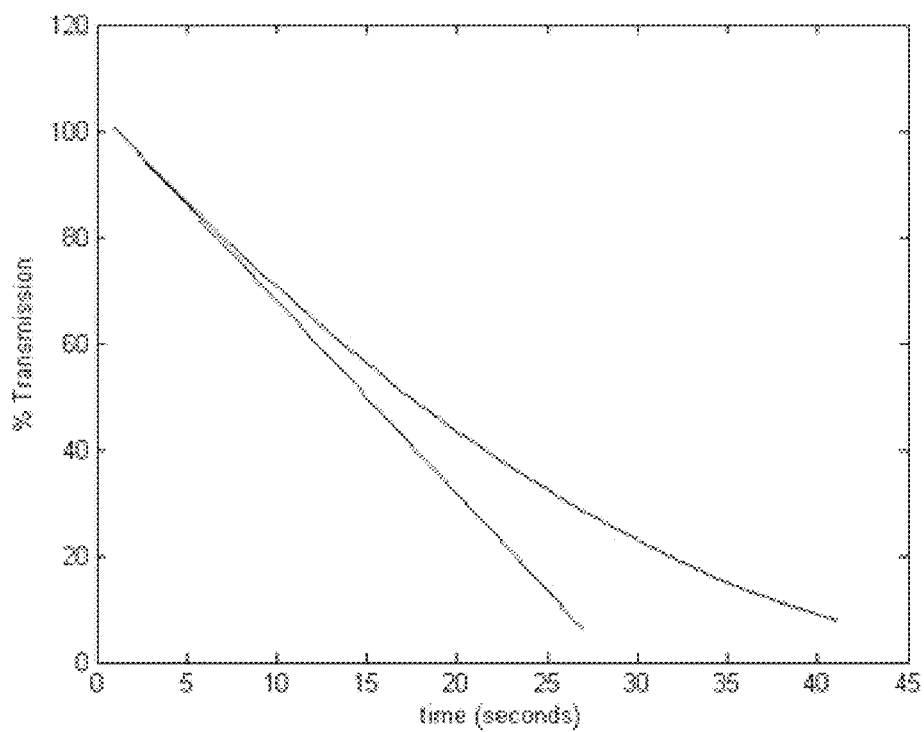
FIG. 9 is a plot according to an embodiment of the present disclosure.

Equation (1) below describes an experimental observable absorbance (Abs) versus time, e.g., related to transmission (trans) versus time data: (1≈Abs+Trans). The solution can be a sum of rising and decaying exponents, but can be simplified to following expression:

$$Abs. \cong -\alpha + \alpha I(\sigma_g - \sigma_{esa}) \cdot t + \frac{\alpha I \sigma_g}{2} \quad (1)$$
$$[k_{ec}(\sigma_{eas} - \sigma_{cc}) - k_f(\sigma_{esa} - \sigma_g) + I(\sigma_{esa}^2 + 2\sigma_{esa}\sigma_g - 2\sigma_g^2)] \cdot t^2$$

where $\alpha$ represents the linear absorption coefficient (cm$^{-1}$), I represents the laser flux (photons/cm$^2$·sec), $\sigma_g$ represents the ground state absorption cross section (cm$^2$), $\sigma_{esa}$, represents excited state absorption cross section (cm$^2$), $\sigma_{cc}$ represents the color-center absorption cross section (cm$^2$), $k_{ec}$ represents the transient color center rate, and $k_f$ represents the fluorescence decay rate. With reference to Equation (1) and FIG. 8, the role color center formation has in embodiments of the present disclosure can be observed. FIG. 9 is a plot according to an embodiment of the present disclosure. With reference to FIG. 9, a plot of Equation (1) is provided in the presence of color center formation (the illustrated arc), and in the absence of color center formation (the illustrated line) for certain, non-limiting, laser-glass interaction parameters: $\alpha$=0.01 cm$^{-1}$, I=4.6·10$^{-21}$ photons/cm$^2$·sec, $\sigma_g$=1.20·10$^{-17}$ cm$^2$, $\sigma_{esa}$=1.21 10$^{-17}$ cm$^2$, $\sigma_{cc}$=2.20 10$^{-13}$ cm$^2$, $k_{ec} \approx k_f \approx 1.0$ 10$^7$ sec$^{-1}$. Setting $\sigma_{cc}$=0, a linear dependence could be made. % Transmission was then formed by the relation that % Transmission=100−% Absorbance. As FIG. 9 illustrates, it follows that simply zeroing the color center formation term (i.e., setting $\sigma_{cc}$=0) transformed the arc to a line using reasonably selected parameter values. Experimentally laser-welded glass substrates generally exhibited this curvature, including without limitation, Eagle XG®, Lotus XT®, Willow, and combinations Willow-to-Willow, Willow-to-Lotus, and Willow-to-Eagle.

Figure 10:
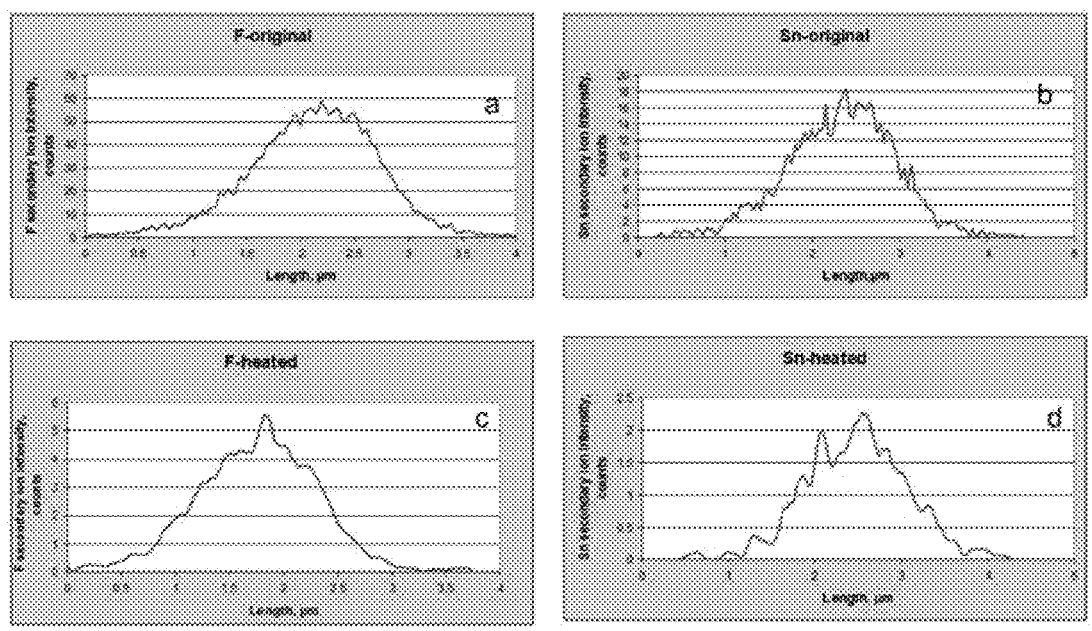
FIG. 10 is a series of plots analyzing diffusion into an Eagle XG® glass substrate from an LMG film layer at the glass interface.

FIG. 10 provides plots analyzing diffusion into an Eagle XG® glass substrate from an exemplary LMG film layer at the glass interface. With reference to FIG. 10, TOF-SIMS was applied to analyze possible diffusion into an Eagle XG® glass substrate from an LMG film layer at the glass interface having an exemplary non-limiting composition (38% SnO, 40% SnF$_2$, 20% P$_2$O$_5$, 2% Nb$_2$O$_5$) and with a thickness of about 0.8 μm under suitable laser-welding conditions. F and Sn line scans over the original interface (a, b) and over the interface subjected to laser welding (c, d) indicate the extent of diffusion away from the interface is small while fluorine migrated approximately half a micron away from the interface and, on average, the tin did not significantly move. Thus, FIG. 10 provides evidence illustrating the lack of significant LMG-material diffusion into an exemplary substrate. Similar findings are also observed with other exemplary inorganic thin films (UVA, IRA, etc.). While one might expect significantly more diffusion of mobile atomic species utilized in embodiments of the present disclosure on the basis of the apparent large CTE mismatch between the interfacial materials, CTE$_{870CHM}$=18 ppm/° C. versus CTE$_{ExG}$=3.1 ppm/° C., no delamination was observed. Rather, repeated cycling of temperatures as high as 600° C. appeared to remove any residual stress, resulting in a stronger bond. The resulting inorganic thin film was sufficiently thin that the delamination forces due to CTE mismatch in the respective glass substrates were much less than the bonding forces. This corresponds to the knowledge that a laminate structure's composite stress from an adhered film's deposition-stress scales with the cube of the film thickness.

Figure 11:
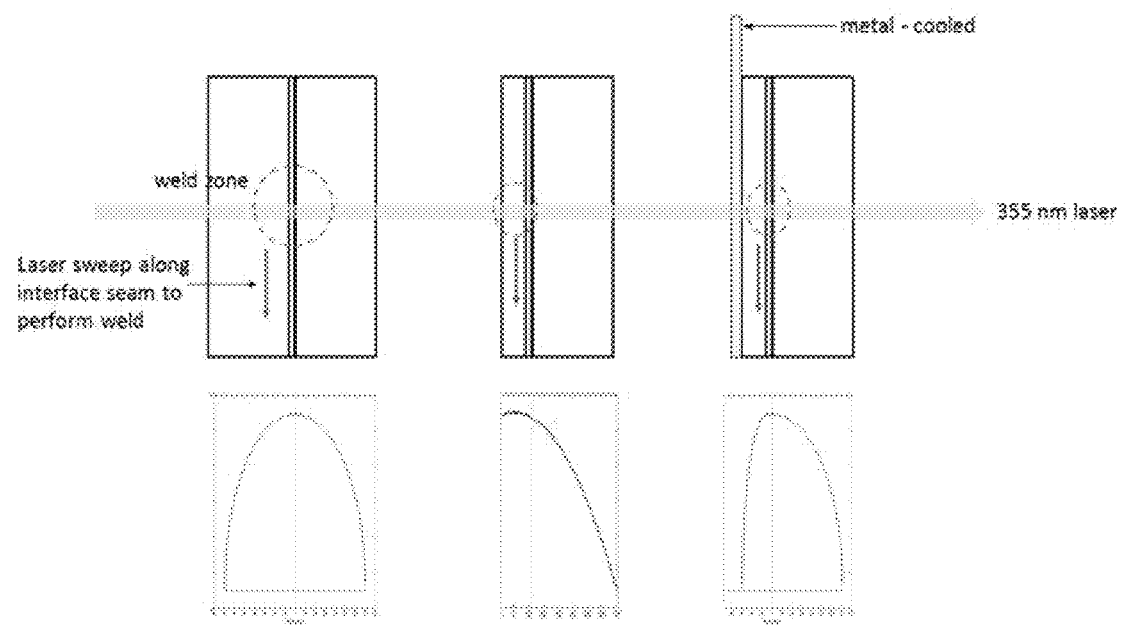
FIG. 11 is a schematic illustration of the performance of laser welding between different thickness glass sheets.

FIG. 11 is a schematic illustration of the performance of laser welding between different thickness glass sheets. With reference to FIG. 11, it was discovered that welding ultra-thin Willow glass (0.1 mm) to Eagle XG® glass (0.7 mm), i.e., an "asymmetric" case, a poor weld can result. In a "symmetric" Eagle-to-Eagle case (left side of FIG. 11), a thermally hot zone was swept along the glass interface to perform a superior weld. A respective temperature distribution is illustrated below each depiction. When using dissimilarly thick glass sheets, an asymmetric thermal zone, however, occurs that can result in a poor weld in some cases, e.g., when welding Willow-to-Eagle (middle diagram of FIG. 11). Exemplary embodiments, however, can provide a solution to this asymmetric welding problem which is illustrated on the right side of FIG. 11 with use of a thermally conductive plate that can dissipate any heat and cool the thin glass sheet to effectively restore the thermal hot zone resulting in the formation of a strong welded bond. Thus, some embodiments herein described can employ the use of thermally conductive plates to laser weld glass sheets having different thicknesses.

Figure 12:
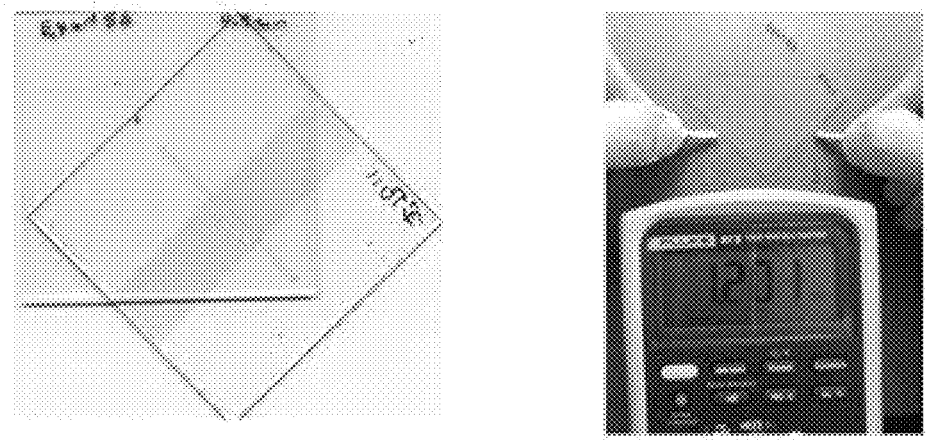
FIG. 12 is an illustration of an experiment assessing the extent of laser welding over ITO leads.

While the description heretofore has described laser welding of glass to glass substrates (of similar or different dimensions, geometries, and/or thicknesses), this should not limit the scope of the claims appended herewith as embodiments are equally applicable to substrates or sheets of non-glass materials, such as, but not limited to ceramics, glass-ceramics, metals, and the like with, or without, an interfacial conductive film. For example, FIG. 12 is an illustration of an experiment assessing the extent of laser welding over ITO leads. With reference to FIG. 12, an LMG-coated Eagle XG® slide is illustrated laser welded to an ITO-coated Eagle XG® slide in the left panel of the figure. In this experiment, a 100 nm ITO film was deposited onto Eagle XG® substrates by reactive sputtering through a mask. Conditions were selected resulting in ITO films having a relatively high average sheet resistance of approximately 126Ω per square (Ω/sq), with a standard-deviation of 23 Ω/sq, reflecting that no thermal heating of the substrate was employed, before, during or after, the reactive sputtering deposition. The ITO film appears in FIG. 12 as a distinct yellowish or shaded strip, diagonally distributed in the photograph. Multimeter measurements of 350Ω were recorded over the distance indicated, prior to laser welding. An LMG-coated Eagle XG® slide was then laser welded to an ITO-coated Eagle XG® slide whereby it was discovered that the laser weld line was quite distinct, strong, transparent, and diagonally distributed but inverted. In the right panel of FIG. 12, post laser-weld measurement of the resistance across the ITO leads over the same distance used earlier was observed to increase the resistance from 350Ω to 1200Ω. The drop in conductivity was due to partial damage of the ITO film as the ITO film absorbed 355 nm radiation. To avoid damage of ITO film due to overheating, however, embodiments can change laser parameters so temperature at the interface does not transition from bare glass substrate to ITO film substrate or otherwise (e.g., variable peak power, variable repetition rate, variable average power, variable translation speed of the beam, electrode pattern, LMG film thickness, etc.).

Figure 13:
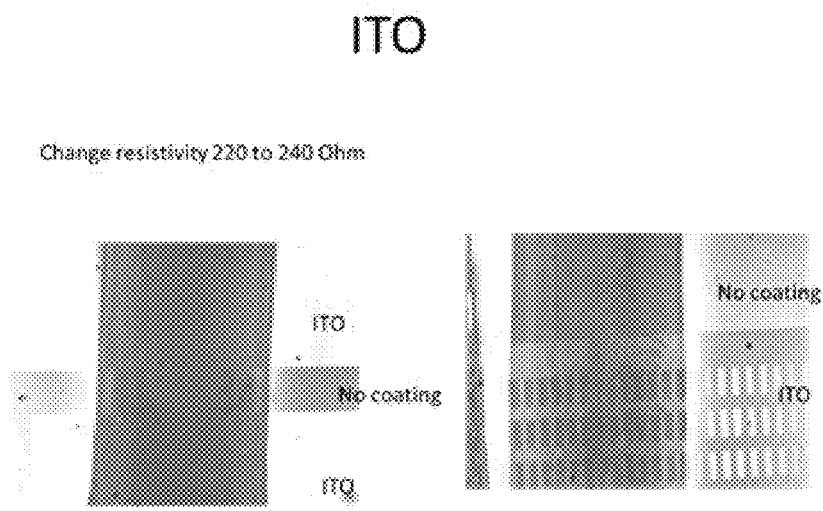
FIG. 13 provides photographs of laser seal lines formed over an ITO patterned film.

FIG. 13 provides additional photographs of laser seal lines formed over an ITO patterned film. With reference to the left panel of FIG. 13, another electrode type was obtained from a different source, again made from ITO and having a thickness of approximately 250 nm. The ITO film was continuous, over which seals were formed using methods described herein. The initial resistance, over an approximate 10 mm distance, was measured at 220 Ohms. Laser sealing was performed at constant speed and power when transitioning from the clear glass to the electrode area. After sealing was performed, a strong seal was observed over both clear glass and ITO regions, with the seal over ITO being slightly wider by approximately 10-15%. Such an increase in seal width may suggest that there is more heat generated in this region than in the clear area. Additional heat generation can also be caused by absorption of the electrode material by the laser radiation or by different thermal diffusivity properties of the film, and in any case, resistance was measured to increase approximately 10% to 240Ω which is insignificant. This can also indicate that when the temperature was raised relative to bare glass, the higher quality ITO and thicker film did not exhibit conductivity degradation. It should be noted that lowering the laser sealing power when it transitions from the clear glass to the electrode area can reduce extra heat generation and therefore decrease resistivity degradation in ITO. Experimental results also suggest that a single electrode split into an array of electrodes (having the same total width as the original electrode) at the seal location(s) can be optimal when using an electrode width between ½-⅓ of the laser beam width, and spacing between ½-⅓ of the beam diameter. Later experiments conducted with an increased sealing speed above 20 mm/s showed that resistance degradation was less <1-2% after sealing with a starting resistance of about 200Ω.

Figure 14:
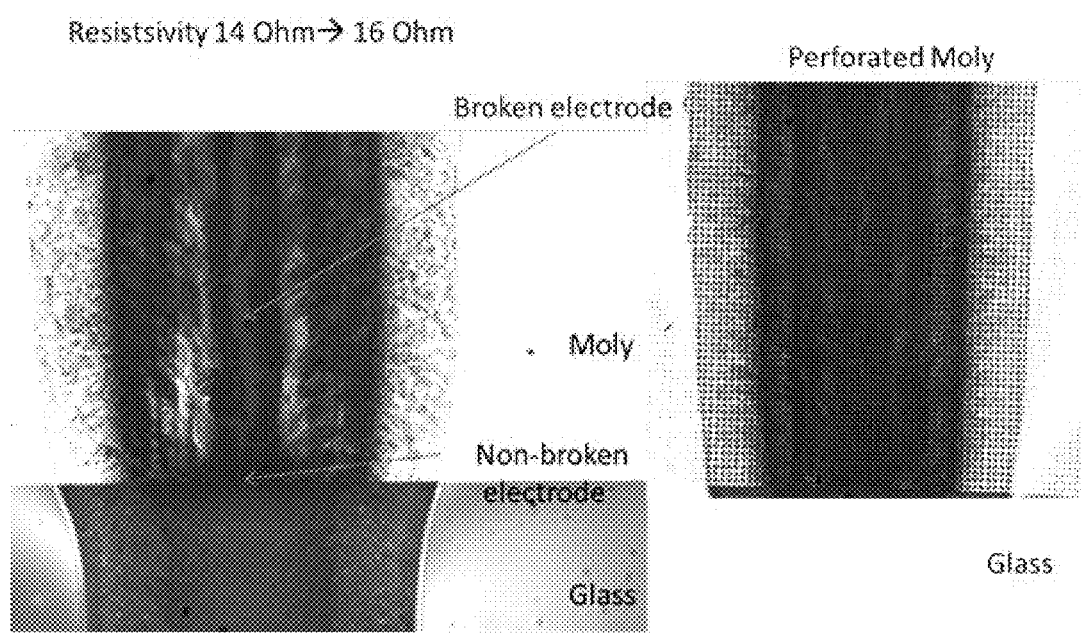
FIG. 14 is a series of photographs of additional laser seal lines formed over a patterned film.

FIG. 14 is a series of photographs of additional laser seal lines formed over a patterned film. With reference to FIG. 14, similar experiments were performed with a non-transparent molybdenum metal electrode. FIG. 14 provides a series of photographs of continuous and patterned molybdenum interfacial film are shown over which laser seal lines were formed. In the left panels, a photograph of a continuous molybdenum film illustrates a more heterogeneous bond formation with cracked or broken molybdenum electrode portions. Even in this case, at constant laser sealing power, the uniform molybdenum electrode was not completely damaged. However, due to laser radiation absorption or reflection by the uniform electrode, the heating was substantially higher at the electrode area than in the clear glass region. This can be observed by the increased width area of the seal over the molybdenum region. It should be noted that one area that was undamaged was at the transition zone between the clear and uniform molybdenum areas thereby suggesting that power adjustment, laser power density, laser spot speed, or combination of all three factors during the sealing event can overcome any overheating effect for a uniform molybdenum electrode. In the right panel of FIG. 14, a photograph of a patterned or perforated molybdenum film illustrates a more homogeneous bond formation resulting in minimal perturbation to its conductivity, namely, 14Ω before welding to 16Ω after welding. The sealing over this perforated region exhibited much less heating and therefore presents an alternative to the power modulation method. It should also be noted that electrode metals should be carefully selected as it was discovered that sealing with metals having a low melting temperature (Al) are unlikely to survive the sealing conditions, in comparison to molybdenum (650° C. vs. 1200° C.) or other metals having a high melting temperature. Thus, the results suggest that a single electrode split into an array of electrodes (having the same total width as the original electrode) at the seal location can be optimal when using an electrode width between ½-⅓ of the laser beam width and spacing between ½-⅓ of the beam diameter. Thus, embodiments of the present disclosure are applicable to laser sealing of glass to glass, metal, glass-ceramic, ceramic and other substrates of equal or different dimensions, geometries and thicknesses.

Applications that may utilize embodiments described herein having efficient formation of high bond-strength, transparent, glass-to-glass welds are numerous and include, but are not limited to, solid state lighting, display, and transparent vacuum insulated technologies. Laser welding of glass, in particular, can provide efficiencies and features such as a small heat affected zone (HAZ) that many traditional welding methods, such as e-beam, arc, plasma, or torch simply cannot provide. In some embodiments, laser glass welding can generally proceed without pre- or post-heating using infrared (IR) lasers for which many glasses are opaque or ultra-short pulse lasers (USPL) for which many glasses are transparent. In some embodiments, a judicious choice of glass substrate compositions and interfacially distributed IR absorbing frit can make hermetic glass "sandwich-type" laser sealed packages possible. In some embodiments, ultra-short pulsed lasers can be focused at either surface or interior points in an exemplary glass substrate and can induce absorption by non-linear processes such as multi-photon or avalanche ionization.

Heretofore, a low-power laser-welding process has been described that relies on an absorbing low melting glass interfacial film and can be attributed to diffusion welding, owing to its low temperature bond formation (as low as half the melting temperature), and requirement for contact and pressure conditions. As discussed above, several effects were notable to laser welding glass sheets together with strong bond formation, e.g., an absorbing low melting glass film at the incident laser wavelength, laser induced color centers formed in the glass substrates, and thermal induced absorption in the substrate to effectively accelerating the temperature increase.

In some embodiments, however, many films highly absorbing at an incident wavelength (e.g., 355 nm) can be sufficient to induce high bond strength laser welds. Other films, for example, ZnO or $SnO_2$, are chemically different than some exemplary low melting glass compositions described herein but share the same laser welding capability at a relatively low light flux. Thus, it was discovered that the low melting character may not be necessary in some embodiments, in light of the melting temperature of ZnO (1975° C.) as compared with some low melting glass compositions (~450° C.). It was discovered, however, that a unifying characteristic of these films was that they absorb radiation substantially at 355 nm: ZnO absorbance ~45% (200 nm thick film), and low melting glass ~15% (200 nm thick film). It was also determined that exemplary methods described herein could laser weld quartz, or pure fused silica substrates—i.e., substrates without color centers. Thus, it has been determined that color centers are not necessarily essential but may be needed in some embodiments when absorption of an exemplary film is low (e.g., ~Abs<20%).

Figure 15:
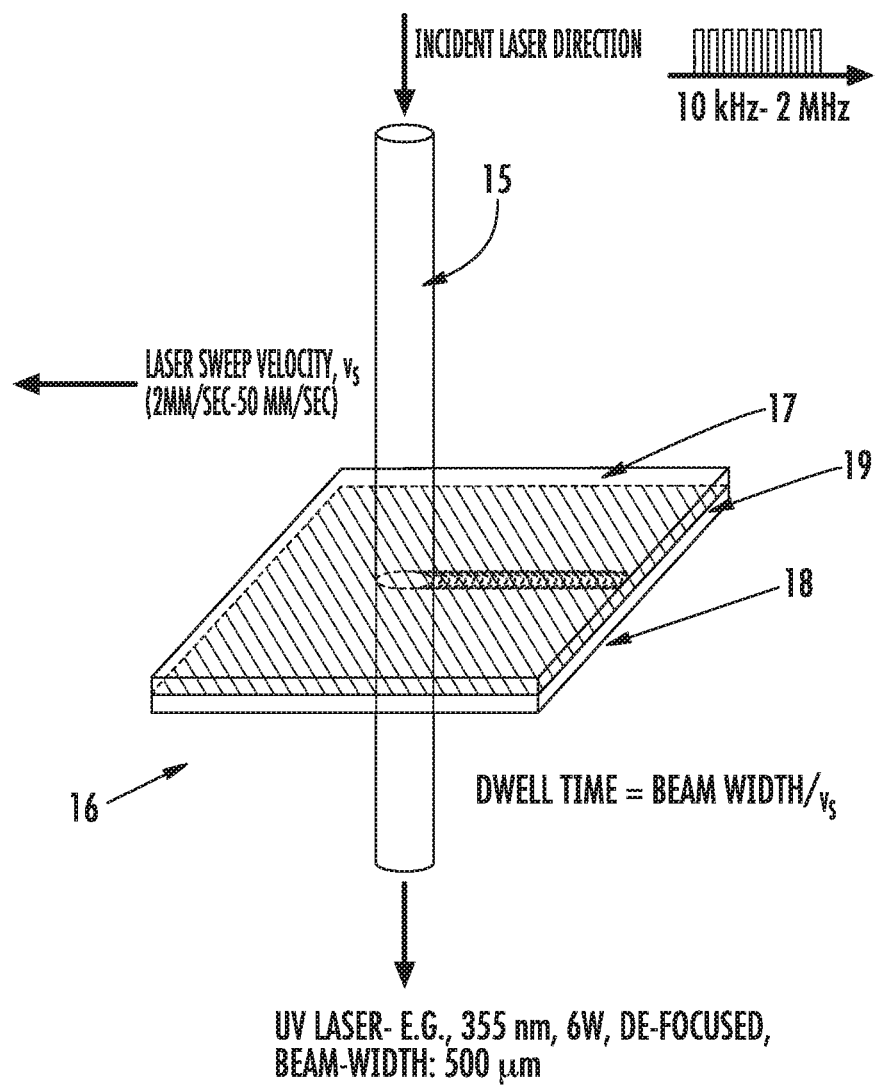
FIG. 15 is a simplified diagram of another method according to some embodiments.

FIG. 15 is a simplified diagram of another method according to some embodiments. With reference to FIG. 15, a defocused laser 15 with a defined beam width w is incident on a sandwich-type structure 16 formed from contacting two sheets of glass 17, 18, with one sheet's interior interface coated with a thin absorbing film 19. While the beam is illustrated as cylindrical, such a depiction should not limit the scope of the claims appended herewith as the beam can be conical or another suitable geometry. The film material can be selected for its absorbance at the incident laser wavelength. The laser 15 can be translated at a predetermined speed, $v_s$, and the time the translating laser beam can effectively illuminate a given spot and can be characterized by the dwell time, $w/v_s$. In some embodiments, modest pressure can be applied during the welding or bonding event, ensuring a sustained contact between the clean surfaces, while any one or several parameters are adjusted to optimize the weld. Exemplary, non-limiting parameters include laser power, speed $v_s$, repetition rate, and/or spot size w.

As noted above with reference to FIG. 3, it was discovered that optimum welding can be a function of three mechanisms, namely, absorption by an exemplary film and/or substrate of laser radiation and the heating effect based of this absorption process, increase of the film and substrate absorption due to the heating effects (band gap shift to the longer wavelength) which can be transient and depends upon the processing conditions, and defect or impurity absorption or color center absorption generated by UV radiation. Thermal distribution can be an important aspect of this process, and the discussion below can be used to assist in the understanding of temperature distribution at the interface between two substrates, assuming static absorption at the interface.

El-Adawi developed an analytical model of laser-heating a two-layer stack consisting of an absorbing film of thickness Z, on a large semi-infinite slab substrate. The heat diffusion equation in each material was solved with matched boundary conditions yielding expressions of temperature as a function of time and position with the film and substrate: $T_f(t,z)$, $T_s(t,z)$. El-Adawi's model assumed thermal properties (diffusivity, D, conductivity, k, heat capacity, $C_p$) of the film and substrate were fixed, such that absorption occurred only in the surface and no phase changes occurred. Laplace transforms were used yielding summations with exponential and error (complementary) function terms:

$$T_f(z_f, t) = \sum_{n=0}^{\infty} \frac{I_0 A_f}{k_f} B^{n+1} \left[ \frac{L_f}{\sqrt{\pi}} e^{-\frac{a_n^2}{L_f^2}} - a_n \cdot \text{erfc}\left(\frac{a_n}{L_f}\right) \right] + \quad (2)$$

$$\sum_{n=0}^{\infty} \frac{I_0 A_f}{k_f} B^n \left[ \frac{L_f}{\sqrt{\pi}} e^{-\frac{b_n^2}{L_f^2}} - b_n \cdot \text{erfc}\left(\frac{b_n}{L_f}\right) \right]$$

$$T_s(z_s, t) = \sum_{n=0}^{\infty} \frac{2 I_0 A_f}{k_f} \frac{B^n}{(1+\varepsilon)} \left[ \frac{L_f}{\sqrt{\pi}} e^{-\frac{g_n^2}{L_f^2}} - g_n \cdot \text{erfc}\left(\frac{g_n}{L_f}\right) \right]$$

where $A_f$ represents the surface absorbance of the thin film, $I_o$ represents the laser flux (photons/$cm^2$·sec), n represents an integer (0≤n≤∞), and all subscripts, f, refer to the film parameters while subscripts, s, refer to the substrate's parameters. B, and ε are related to material properties: $B=1-\varepsilon1+\varepsilon<1$, $\varepsilon=(k_s/k_f)\sqrt{D_f/D_s}$, while $L_f$ also includes time t: $L_f=4D_ft$. The time and space range for the thin film layer can be provided as: 0<t, $0 \leq z_f \leq Z$, respectively, where Z represents the film thickness. The time and space range for the substrate layer are provided as: $t_s$<t, $Z \leq z_s \leq \infty$, respectively, where $t_s$ represents the time it takes the temperature of the film's backside to begin deviation from room temperature after initial laser-film incidence ($t_s=Z^2/6D_f$). Expansion coefficients are related to independent variables and material properties through the following expression:

$$a_n = 2Z(1+n) - z_s, \ b_n = 2nZ + z_f, \ g_n = (1+2n)Z + z_s \sqrt{\frac{D_f}{D_s}} \quad (3)$$

Figure 16:
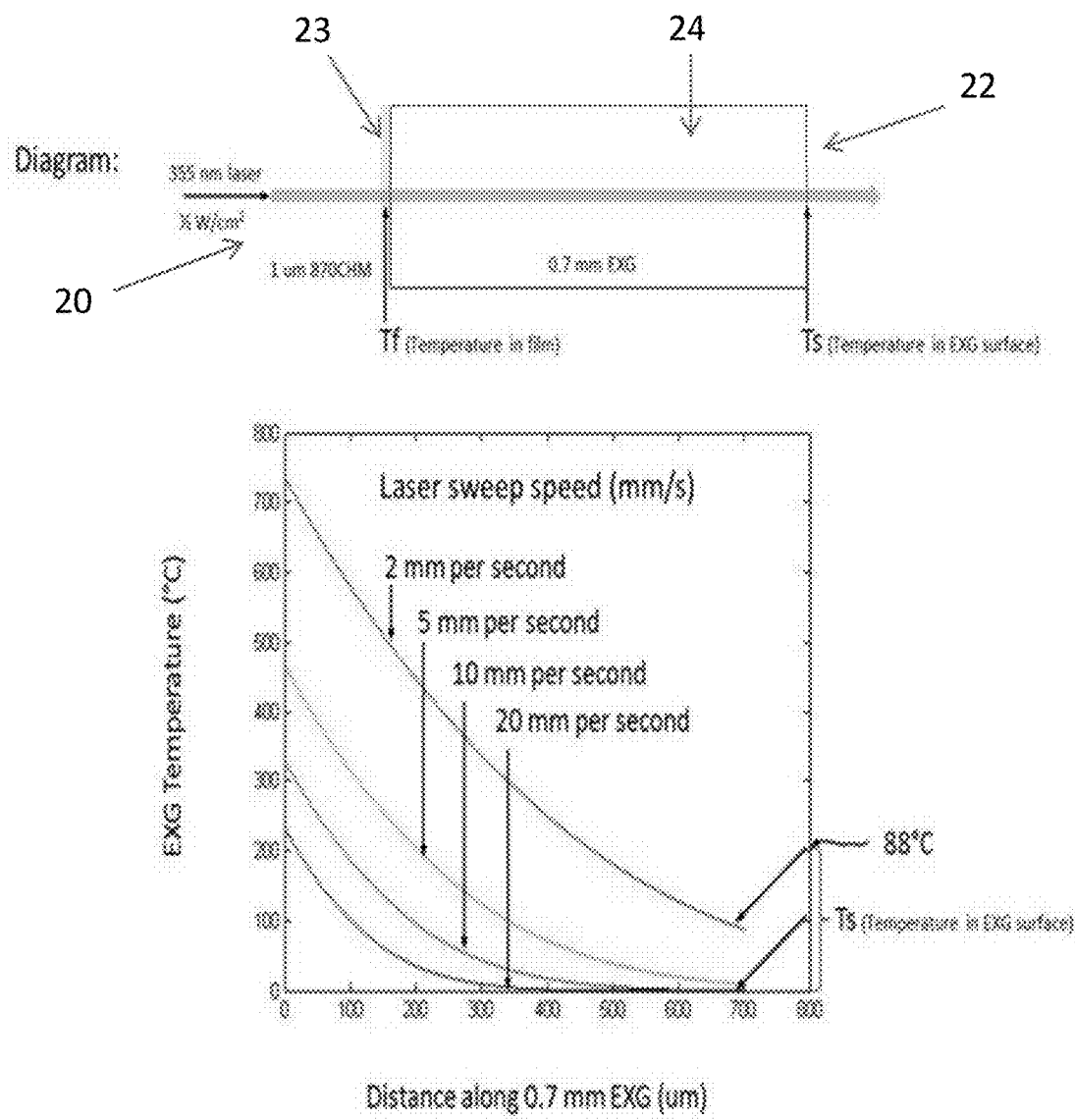
FIG. 16 is a two-layer laser heating surface absorption model for some embodiments.

FIG. 16 is a two-layer laser heating surface absorption model for some embodiments. With reference to FIG. 16, a pulsed UV (355 nm) laser 20 is illustrated striking a two-layer stack 22 having a 1 μm UV absorbing-film 23 and a 700 μm Eagle-XG substrate 24. Spatial temperature distribution away from the weld interface in the Eagle-XG stack 22 can be calculated from Equation (2) and plotted assuming a pulsed (30 kHz, 10 ns pulse width, 500 μm wide laser beam-waist diameter) 355 nm laser which delivers an average power of 6 Watts. Different laser sweep speeds (2 mm/s, 5 mm/s, 10 mm/2 and 20 mm/s) were then used. A UV film absorbance of 15% was employed for the calculation, a value typical of tin-fluorophosphate LMG materials at 355 nm with a thickness of about 200 nm. This temperature distribution in the Eagle XG® substrate or stack 22 was plotted whereby temperature distribution variations due to using different laser sweep speeds was observed as a slow moving laser beam dwells over a given laser weld site longer as compared with faster moving beams. For example, the effective time a 500 μm wide laser beam, moving at 2 mm/s dwelled over a given weld spot was 0.25 seconds while the 20 mm/s sweeping laser beam dwelled only 0.025 seconds.

Figure 17:
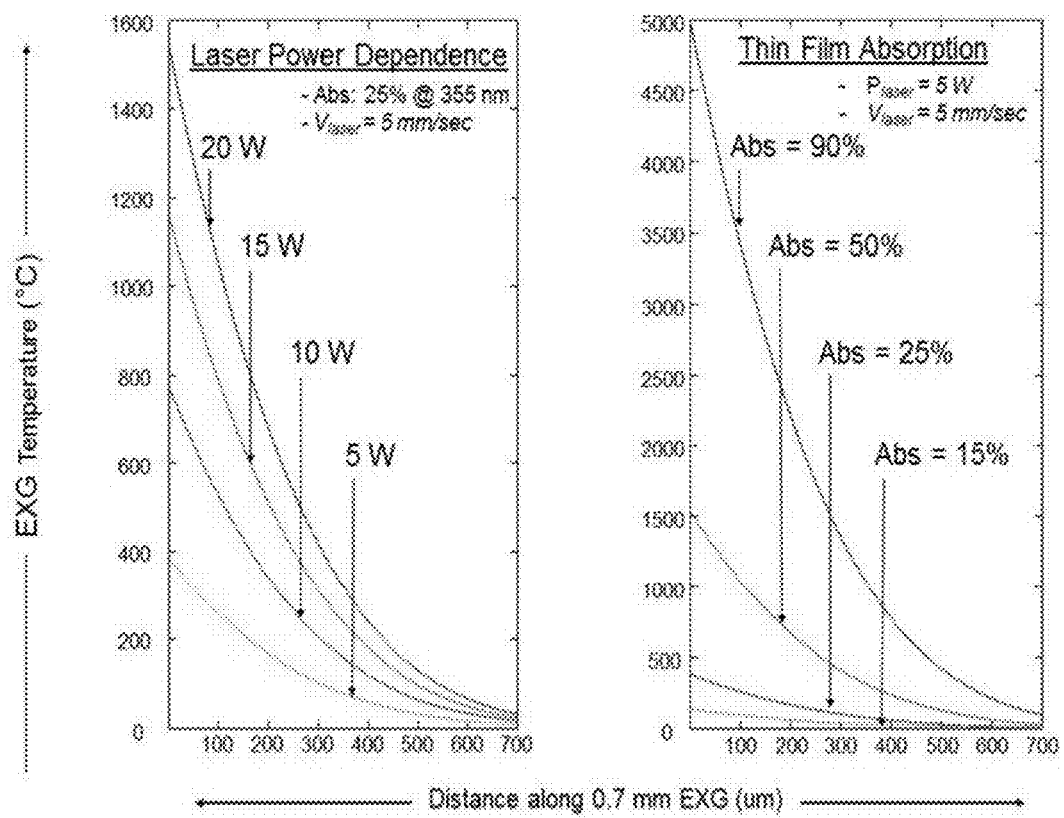
FIG. 17 is a series of temperature variation plots for some embodiments.

Temperature variations due to using different laser powers, or films with differing absorbance were also explored as illustrated in FIG. 17. FIG. 17 is a series of temperature variation plots for some embodiments. With reference to FIG. 17, glass substrate temperature distribution dependence on laser power and film absorbance was plotted using the two-layer laser-heating model (Equation (2)). The same laser parameters used in FIG. 16 were used in FIG. 17. More specifically, a pulsed UV laser with the following parameters was used: λ=355 nm, beam waist=500 μm, repetition rate=30,000 Hz, and pulse width=10 ns. As can be observed in the left panel of FIG. 17, the influence of laser power on the substrate temperature distribution appears more linear as compared with the higher order behavior of absorbance in the right panel of FIG. 17. This behavior is not obvious from Equation (2) where power, $I_o$, and absorbance, $A_f$, appear coupled. Absorbance can indirectly impact the effective film thickness, $z_f$, for which the expansion coefficients $b_n$ and $g_n$ are somewhat related. In contrast, $I_o$ is independent, with no functional relationship associated with the expansion coefficients $b_n$, and $g_n$.

Figure 18:
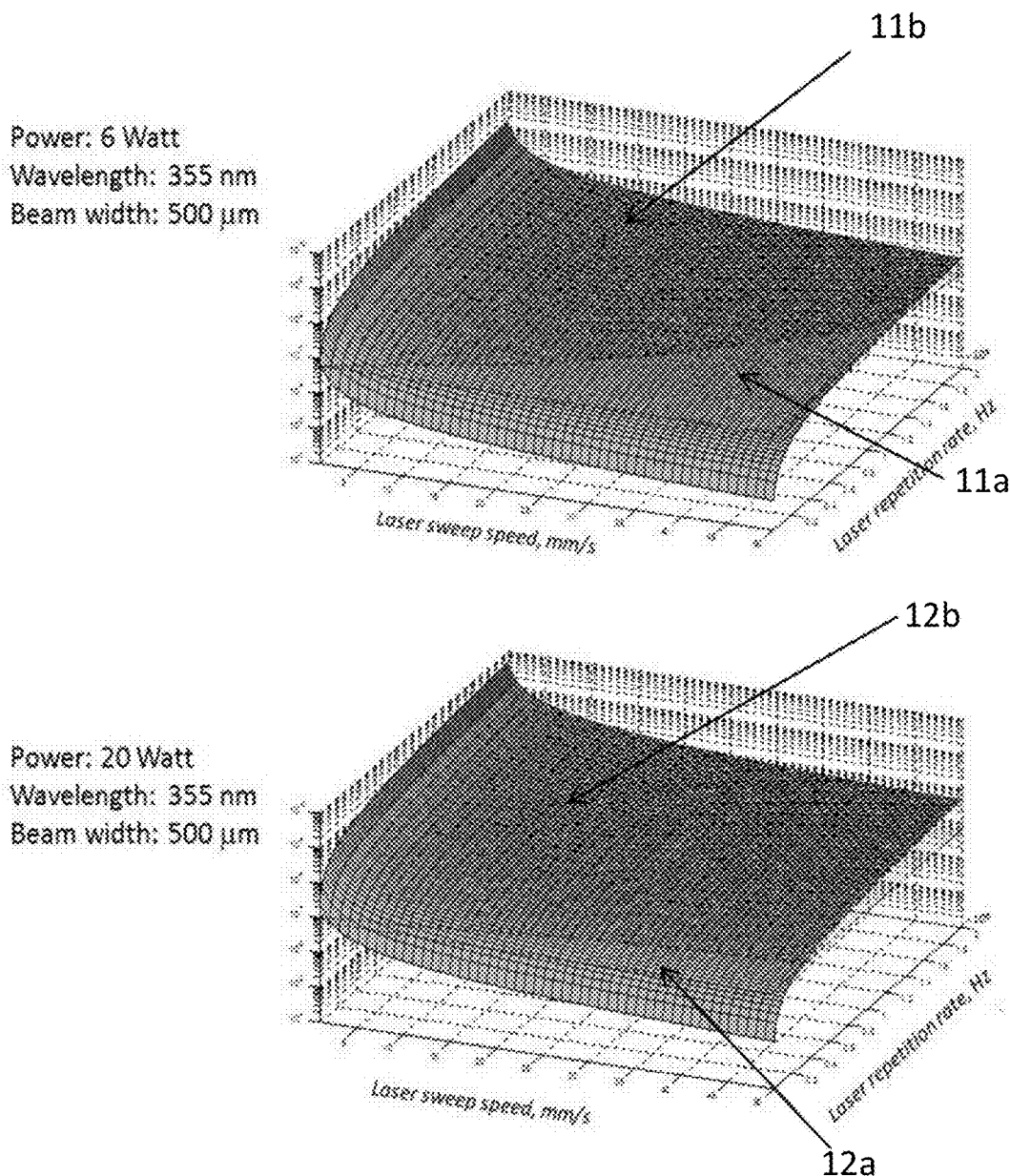
FIG. 18 is a series of plots of average energy deposited within a sweeping laser's dwell time for some embodiments.

FIG. 18 is a series of plots of average energy deposited within a sweeping laser's dwell time for some embodiments. With reference to FIG. 18, it can be observed that dwell time is dependent on both laser sweep speed and laser pulse repetition rate, whose values and units are indicated in the independent variable x-y plane. These calculations assume a film absorbance of 25%, 500 micron laser beam width, and 10 ns laser pulse width—that can result in successful laser glass welds in some embodiments. Threshold power (11a for 6 W, 12a for 20 W), that power above which successful laser welding occurs, is indicated in FIG. 18 with the depicted plane, and empirically estimated from experiments. The top and bottom plots or panels vary in the amount of laser power used: 6 Watts versus 20 Watts. Comparison of both plots in FIG. 18 suggests that slight variation in laser speed and repetition rate at low incident laser powers (e.g., 6 Watts) can incur substantially higher incident powers than is necessary to induce adequate laser welds. Even small excursions away from the initial laser-weld condition (30 kHz, 2 mm/s laser sweep velocity) in the direction of higher repetition rate would result in unnecessary incident power densities. Higher laser sweep speeds rapidly provided inadequate amounts of energy required to laser weld the glass substrates which is a consequence of the inverse dependence of laser dwell time on velocity versus the linear dependence on laser repetition rate. At higher incident laser powers (e.g., 20 Watts), a larger plateau region or process window 11b, 12b becomes available where small excursions in speed and repetition rate retain adequate laser welding conditions without excess energy being incurred. The process windows 11b, 12b for both plots can facilitate laser welding or bonding optimization.

Figure 19:
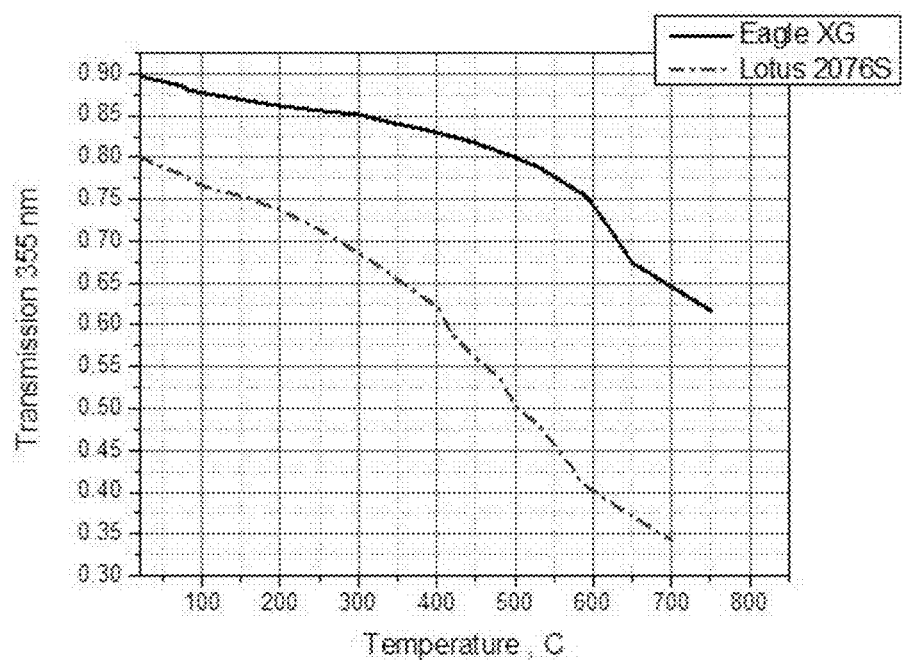
FIG. 19 is a plot of Eagle XG® and Lotus XT® glass transmission at 355 nm during heating with an IR radiation source.

FIG. 19 is a plot of Eagle XG® and Lotus XT® glass transmission at 355 nm during heating with an IR radiation source. With reference to FIG. 19, effects of temperature change on the absorption properties of the glass interface was determined through experimentation when Eagle XG® and Lotus XT® substrates were irradiated with an infrared $CO_2$ laser at 10.6 μm. It can be observed that the resulting transmission of these substrates at 355 nm changed significantly depending upon temperature generated by the $CO_2$ laser radiation. It follows that interface heating in some embodiments can lead to a more effective absorption at the interface in both the film as well as the glass substrate.

Figure 20:
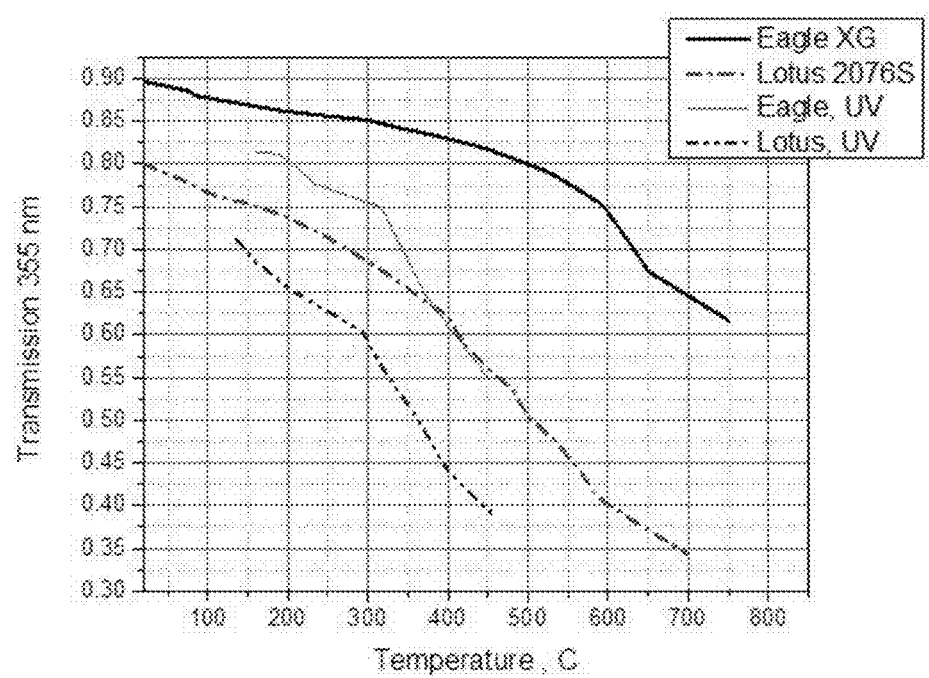
FIG. 20 is a plot of glass transmission at 355 nm during heating for some embodiments.

FIG. 20 is a plot of glass transmission at 355 nm during heating for some embodiments. With reference to FIG. 20, it was discovered that color center formation due to UV radiation can occur in both the film and glass substrate which can lead to additional absorption in the radiated area. The effect of 355 nm transmission on Eagle XG® and Lotus XT® glass substrates can be observed in FIG. 20 due to the resultant temperature increase. The temperature increase can be attributed to a combination of the effect of heating shown in FIG. 19 and color center formation.

Figure 21:
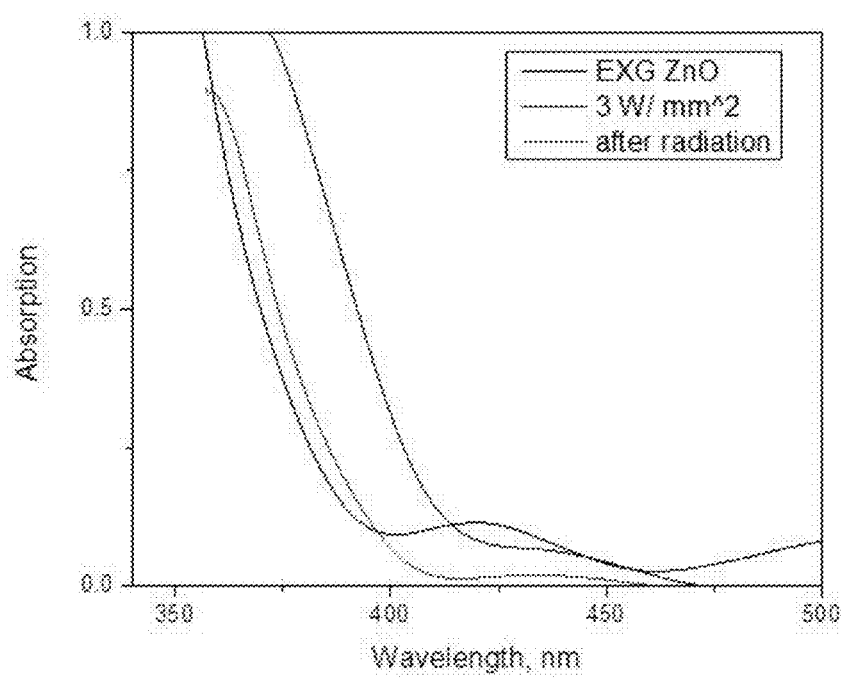
FIG. 21 is a plot of the effect on film and substrate transmission during and after UV radiation for some embodiments.

FIG. 21 is a plot of the effect on film and substrate transmission during and after UV radiation for some embodiments. With reference to FIG. 21, the first curve 30 represents the transmission of an Eagle XG® 0.6 mm substrate with a 200 nm ZnO film. A second curve 31 represents transient absorption due to 3 W/mm² radiation with a 355 nm laser source, 30 kHz repetition rate (i.e., absorption on top of existing absorption). This second curve 31 includes induced absorption due to color centers and temperature. A third curve 32 represents induced absorption after laser radiation is off, i.e., the temperature has recovered to ambient conditions, and color centers have partially vanished. It should be noted that there are some permanent absorption changes in these embodiments which have high transmissions at 420 nm and above. This effect is due to the film presence and is significantly amplified versus a bare substrate without film. Some changes in the film and substrate can be permanent as observed in the third curve 32, but this does not affect visible transmission. In addition to these UV-based radiation effects, it can be observed that a desired temperature rise and fusion can occur based on absorption of the film alone, and this effect can also be realized with IR absorbing films as will be discussed below. Thus, as illustrated in FIG. 21, some exemplary films can exhibit temperature and color center formation as a function of temperature and power density of UV radiation.

Figure 22:
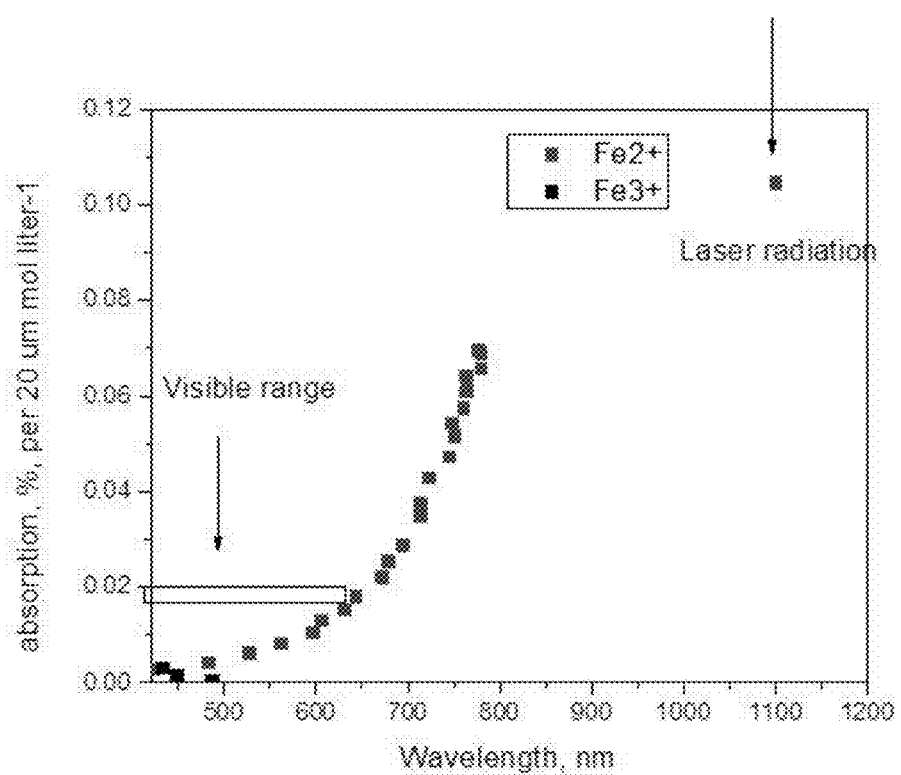
FIG. 22 is a plot of absorption versus wavelength for some embodiments.

FIG. 22 is a plot of absorption versus wavelength for some embodiments. With reference to FIG. 22, an embodiment included a film made with an FeO based glass, which can be in two different oxidation states 2+ and 3+ depending upon processing conditions. This exemplary, non-limiting silica based glass film has greater than about 10-15 wt. % FeO with an equal proportion thereof being FeO and $Fe_2O_3$. As illustrated in FIG. 22, it was discovered that the $Fe_2O_3$ exhibited strong absorption at MR wavelengths and could also be irradiated with a YAG laser at a wavelength of 1064 nm. The visible transmission in this case is less than about 0.02 and does not compromise attenuation between about 420 nm to about 700 nm. Absorption at 1064 nm was found to be about 0.1 and the exemplary film could be heated with sufficient laser power above its melting point and laser welded. Of course, the claims appended herewith should not be so limited as other examples of IR absorption films and other IR lasers are envisioned.

Figure 23:
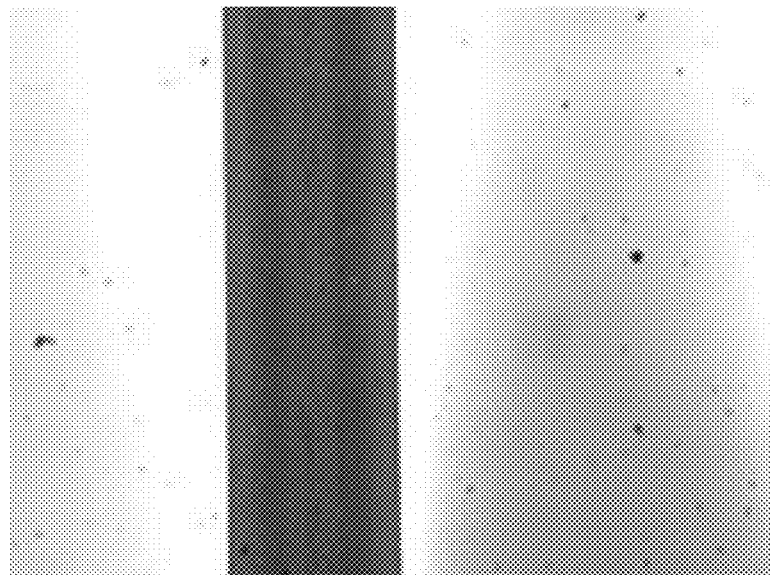
FIG. 23 is a photograph of a laser seal or bond line for an exemplary low melting glass film on Eagle XG® glass.
Figure 24:
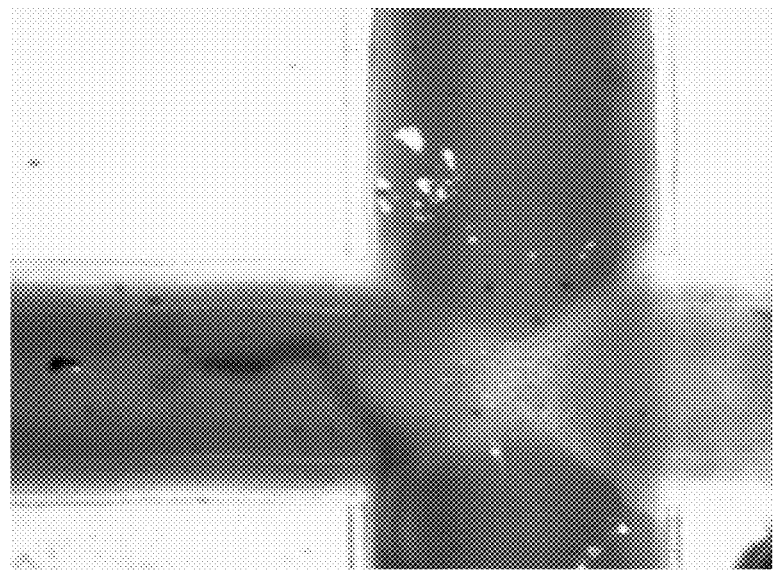
FIG. 24 is a photograph of crossing laser seal lines for an exemplary low melting glass film on Eagle XG® glass.
Figure 33:
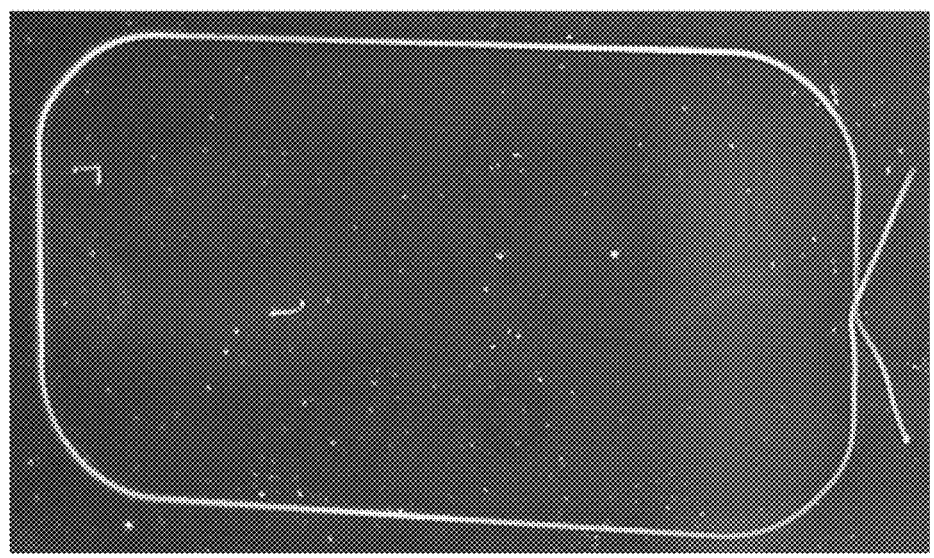
FIGS. 33 and 34 are photographs of weld lines in some embodiments.
Figure 34:
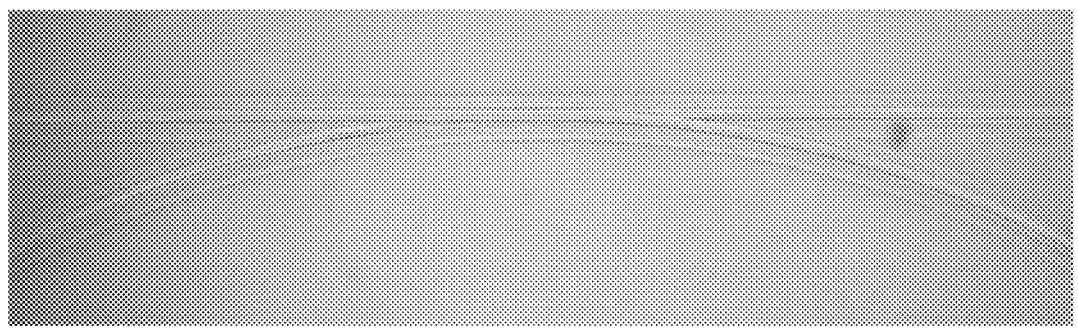

FIG. 23 is a photograph of a laser seal or bond line for an exemplary low melting glass film on Eagle XG® glass. FIG. 24 is a photograph of crossing laser seal lines for an exemplary low melting glass film on Eagle XG® glass. FIGS. 33 and 34 are photographs of weld lines in some embodiments. With reference to FIGS. 23, 24, 33 and 34 exemplary welds made with a UV laser at different conditions are illustrated. More specifically, FIG. 23 illustrates a 200 μm laser seal line using a 1 μm thick low melting glass film on Eagle XG® glass, and FIG. 24 illustrates the crossing of two 400 μm lines using a 1 μm thick low melting glass film on Eagle XG® glass. The width of the weld, seal or bond lines can be varied by modification of the spot size at the interface of the respective substrates. It was also noted during experimentation that no cracks in either the film or substrates were formed in either instance (single or crossing welds). With reference to FIG. 33, laser weld lines can be observed in a Lotus XT® glass stack having 1 μm low melting glass film intermediate the two substrates. Welding conditions included a 1 MHz repetition rate, 10 W laser power, and 100 mm/s translation speed resulting in a 190 μm line width. With reference to FIG. 34, crossing laser weld lines in an Eagle XG® glass stack having a 1 µm low melting glass film can be observed. Welding conditions included a 1 MHz repetition rate, 4 W laser power, and 200 mm/s translation speed resulting in an 80 µm line width.

Figure 25:
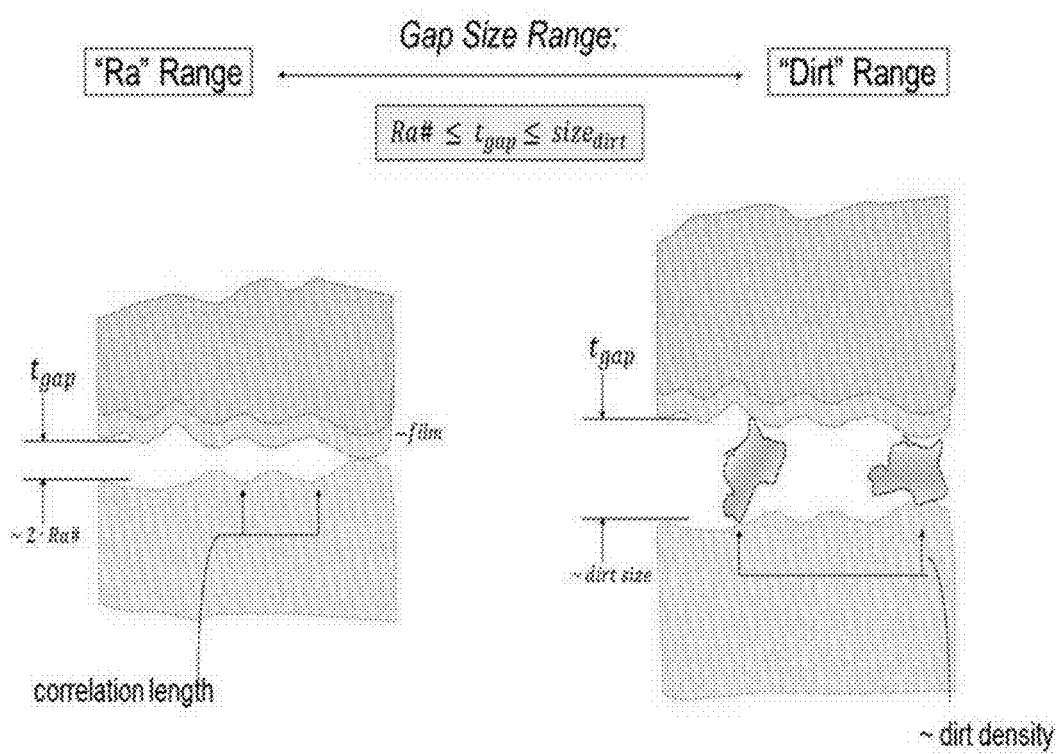
FIG. 25 is a schematic illustration of the range of interface contact geometries observed while laser welding for some embodiments.

FIG. 25 is a schematic illustration of the range of interface contact geometries observed while laser welding for some embodiments. With reference to FIG. 25, the left panel represents an interface condition occurring in an "Ra" range where thickness of the gap $t_{gap}$ is dominated by the local surface roughness, statistically characterized by the Ra number, with in-plane spatial distribution of asperities characterized by a spatial correlation length. The right panel of FIG. 25 represents an interface condition occurring in a "dirt" range where thickness of the gap $t_{gap}$ is dominated by the statistics of prevailing dirt particle-size distribution, with in-plane spatial distribution dominated by dirt density distribution. Thus, it can be observed that gap thickness in the Ra range is dependent on the glass substrate surface statistics, ranging from ultra-smooth values as low as fractions of a nanometer (e.g., crystalline range), to tens of nanometers at the upper range representing values typical of commercially available glass (e.g., soda lime, boro-silicates).

Figure 26:
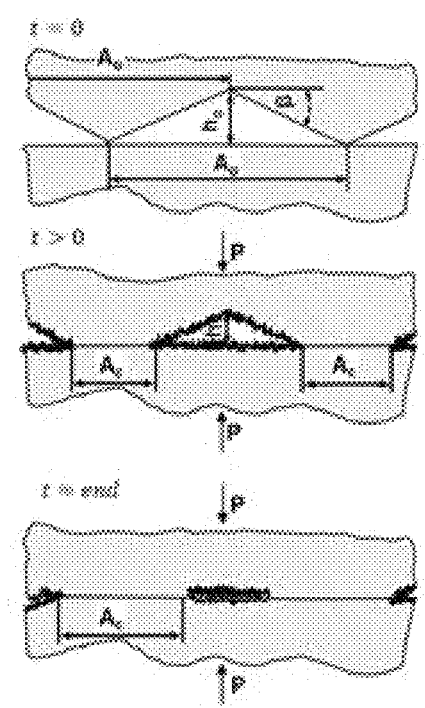
FIG. 26 is a schematic illustration of the evolution of relative contact area, $A_c/A_0$, during laser welding of the interfacial gap region under constant applied pressure $P_{ext}$.

Exploring a potential mechanism underlying laser welding dynamics, diffusion-weld creep flow, it can be observed that relatively low temperature bond formation occurs as low as half the melting temperature of the glass substrates, and that contact and pressure conditions may be required in some embodiments. Mass transport of mostly substrate material into the gap occurs in a manner consistent with hot swelling expanding glass activated by temperatures above the substrate strain point. The movement of this material can be described by one of various forms of creep flow typically found in diffusion welding models, namely, viscous, plastic, or diffusive transport processes. While these models are often used in the description of metal welding, they can be adapted for the present case, using the notion of relative contact area, $A_c/A_0$, and its kinetic development illustrated in FIG. 26. FIG. 26 is a schematic illustration of the evolution of relative contact area, $A_c/A_0$, during laser welding of the interfacial gap region under constant applied pressure $P_{ext}$. With reference to FIG. 26, in the top panel, time=0 and the initial condition of the relative contact area $A_c/A_0=0$. In the middle panel, time is greater than 0 illustrating an intermediate state of the interfacial gap region where $A_c/A_0>0$. In the bottom pane, time is at a predetermined point (t end) where the weld or bond is essentially complete and the gap is effectively non-existent, $A_c/A_0 \approx 1$. Formation of a diffusion-welded interface typified by FIG. 26 assumes an evolution of relative contact area, $A_c/A_0$, that converges to distances at which chemical bonds form. An approximation can be employed to describe these kinetics:

$$\frac{A_c}{A_o} = 1 - \exp^{-\frac{t}{t^*}} \text{ where } t^* = k \cdot p^n e^{\frac{Q}{RT}} \quad (4)$$

where k represents a constant, p represents pressure, n represents a pressure exponent, and Q represents an activation energy of the specific rate-controlling creep-flow mechanism. The value of n can be correlated with the rate-controlling mechanism as follows: n=1, for viscous mass transport; n=2, for plastic flow; n=3, for evaporative/condensation transport; and n>3, for diffusive transport.

Figure 27:
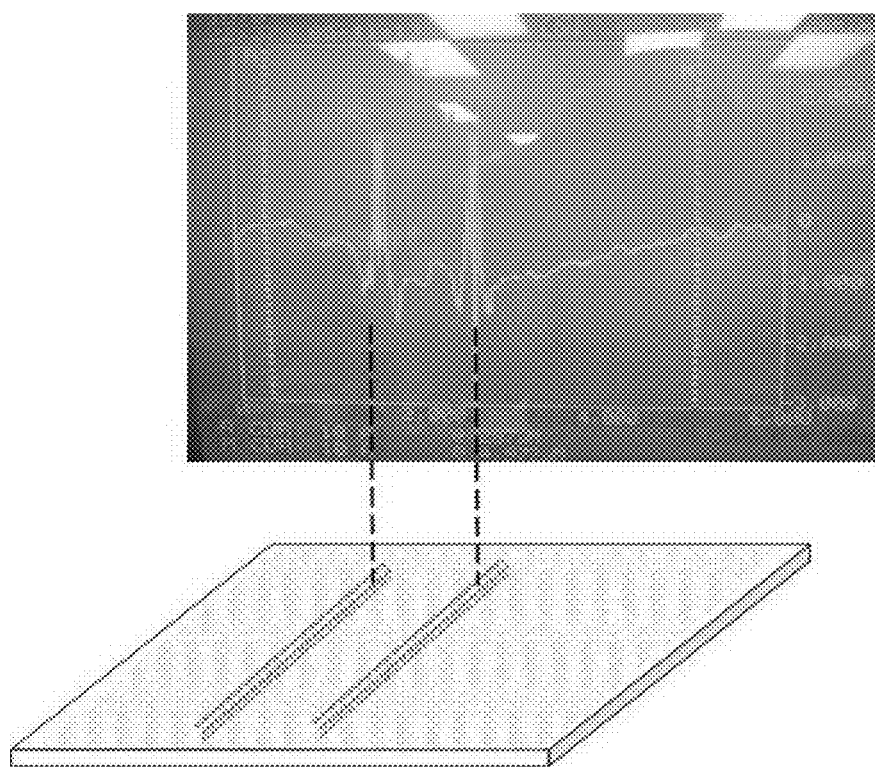
FIG. 27 illustrates a profilometer trace over a laser sweep region of an embodiment using typical laser welding conditions.

Equation (4) can be employed as a guide in deducing some mechanistic forces at work since the expression assumes isothermal conditions. To begin this mechanistic exploration and because of its similarity to Eagle XG® (softening point: 971° C.), parameters can be used from the literature of a 3-point bend experimental study over the range from 800° C.-950° C., of the high temperature creep of low softening-point boro-silicate glass (700° C.-750° C.) where it was found, for all stages of creep, that deformation behavior exhibited linear viscoelasticity controlled by viscous flow for both fast and slow creep regimes. Using fast creep regime data (n=1, Q=160 kJ/mol, and k=0.00048 Pa$^{-1}$ s), with conditions similar to some laser welding experiments (950° C.), the total effective pressure of the weld area can be estimated, $P_{total}$, at 950° C. as 600 MPa assuming Eagle XG®'s nominal modulus and CTE values of 73.6 GPa and 3.1 ppm/° C. apply, beyond that of the nominal applied pressure of about 0.1 MPa. This upper bound estimation was based on experimental data measured indicating substrate glass, and film material, swelling and expanding above the planar interface region as illustrated in FIG. 27. FIG. 27 illustrates a profilometer trace over a laser sweep region of an embodiment using typical laser welding conditions. With reference to FIG. 27, the bottom schematic represents a single low melting glass coated (1 µm thick film) Eagle XG® substrate subjected to two successive laser sweeps under the following conditions: 355 nm, 30 kHz, 4 mm/sec translation rate. The top image of FIG. 27 is a single-line profilometer trace over these two weld regions indicating a raised morphology.

Figure 28:
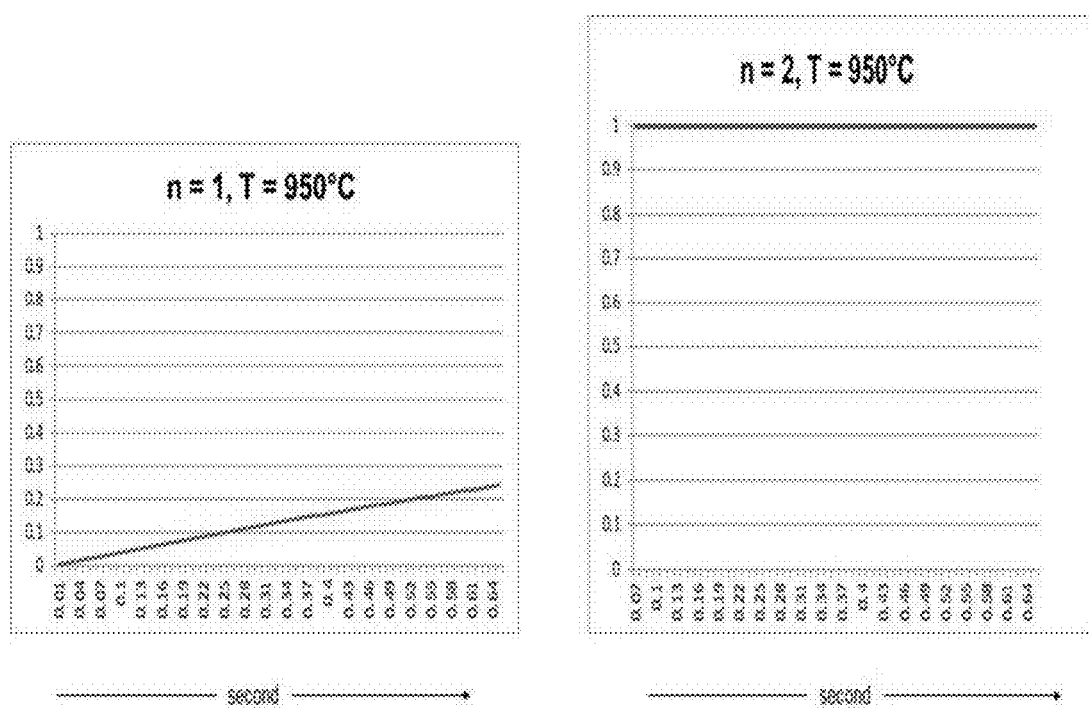
FIG. 28 is a series of plots providing a comparison of welding rate estimates for some embodiments.

Even assuming temperature is fixed at 950° C., it may be noted whether the viscous flow mechanism under that condition is sufficient in forming and driving diffusion welds to completion ($A_c/A_0 \approx 1$). FIG. 28 provides some insight to this case. FIG. 28 is a series of plots providing a comparison of welding rate estimates for some embodiments. With reference to FIG. 28, a comparison of welding rate estimates can be based upon Equation (4) using low strain and softening point boro-silicate glass creep flow parameters and an effective welding pressure of 600 MPa. The two plots differ only in assuming either viscous flow prevails (left plot) or plastic flow (right plot). Recalling that dwell times on the order of 0.25 seconds yield strong laser welds under about 6 Watts and 30 kHz laser repetition rate conditions, the viscous flow interpretation may be questioned, and the left plot in FIG. 28 suggests other mechanisms, e.g., plastic flow, that may also account for the strong weld formation.

Figure 29:
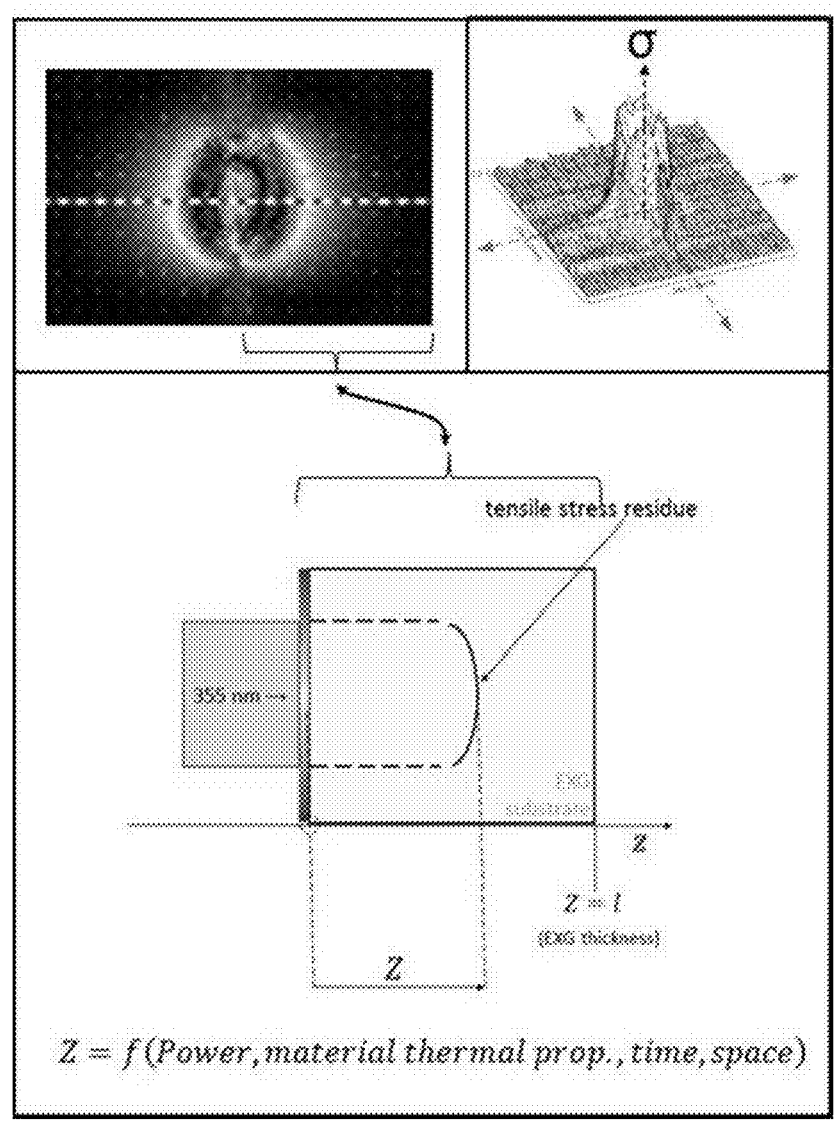
FIG. 29 is a schematic illustration of polarimetry measurements and images of some embodiments.

FIG. 29 is a schematic illustration of polarimetry measurements and images of some embodiments. With reference to FIG. 29, residual stress fields resulting from an exemplary laser welding process near the interfacial weld bond can be examined. For example, the top panels of FIG. 29 illustrate a polarimetry measurement of stress field in the vicinity of a laser weld between two 0.7 mm Eagle XG® glass substrates, with one interior surface coated with a 1 µm thick low melting glass film. The upper left panel provides a polarimetric image of residual stress field from a laser weld obtained from sweeping a 355 nm UV laser under the following conditions: 20 mm/sec, 14 Watts, 200 µm beam width, and 150 kHz repetition rate, and the upper right panel provides a three dimensional rendering of this residual stress field. In the bottom panel of FIG. 29, an illustration is provided showing a propagating stress field and the analytic dependence sought of its location from laser weld conditions. Influences on the location of the propagating stress field under the prevailing laser weld conditions can then be estimated. Analytical models, however, tend to treat simple structures as a semi-infinite solid or slab. Equation (2) illustrates how complicated solutions can be for two-layer systems, which can rapidly become intractable with the introduction of a time dependent melt or stress front. One model of melting considered a slab connected to a heat sink with the incident laser radiation entirely absorbed at the surface. This model considered two time regimes: one regime where the melting time was less than the transit time (e.g., the time it took for the back end of the slab to increase from room temperature), and the second regime for melting times greater than the transit time. This model also envisioned a heat balance equation applied to a propagating interface between liquid and solid:

$$I_0 \cdot A(1-R) + k\frac{dT}{dz} = \rho \cdot Q_L \frac{dZ}{dt} \quad (5)$$

where terms are identical with those used in Equation (2), except that Z represents the melt front location, $Q_L$ represents the latent heat of melting, and that heat flow is one dimensional, optical radiation is absorbed at the surface, and thermal material properties remain temperature independent. Quadratic equations can then be derived in both Z and dZ/dt having coefficients that are functions of thermophysical and laser parameters. To understand dependences of a propagating stress field, the propagating laser melt front analytic model may be modified by substituting the latent heat of melting (fusion) of Eagle XG® with the activation energy for creep flow from our previous Eagle XG® surrogate: the low strain point boro-silicate glass normalized with its effective molecular weight (160 kJ/mol)/(0.266 kg/mol). Considering the case where no heat is dissipated from the back of the slab substrate during the weld, the resulting expression exhibits interesting dependencies on laser and material properties:

$$Z = l - \frac{\sqrt{C_p l^2 I_o A(1-R) \cdot \rho^3 \cdot [C_p l \rho(l \cdot I_o A(1-R) + 6\lambda \cdot \Delta T_m) - 6\lambda \cdot I_o A(1-R) \cdot t]}}{\sqrt{3} \cdot I_o A(1-R) \cdot C_p \cdot l \cdot \rho^2} \quad (6)$$

where Z represents creep front location, l represents substrate thickness, Cp represents substrate heat capacity, A represents substrate absorbance, R represents substrate reflectance, $\Delta T_m$ represents propagating temperature increase, from ambient, required for maintaining creep flow (e.g., $\Delta T_m = T_{strain} - T_{ambient}$), ρ represents substrate density, λ represents substrate thermal conductivity, $I_0$ represents laser irradiance (W/m²), and t represents time.

Figure 30:
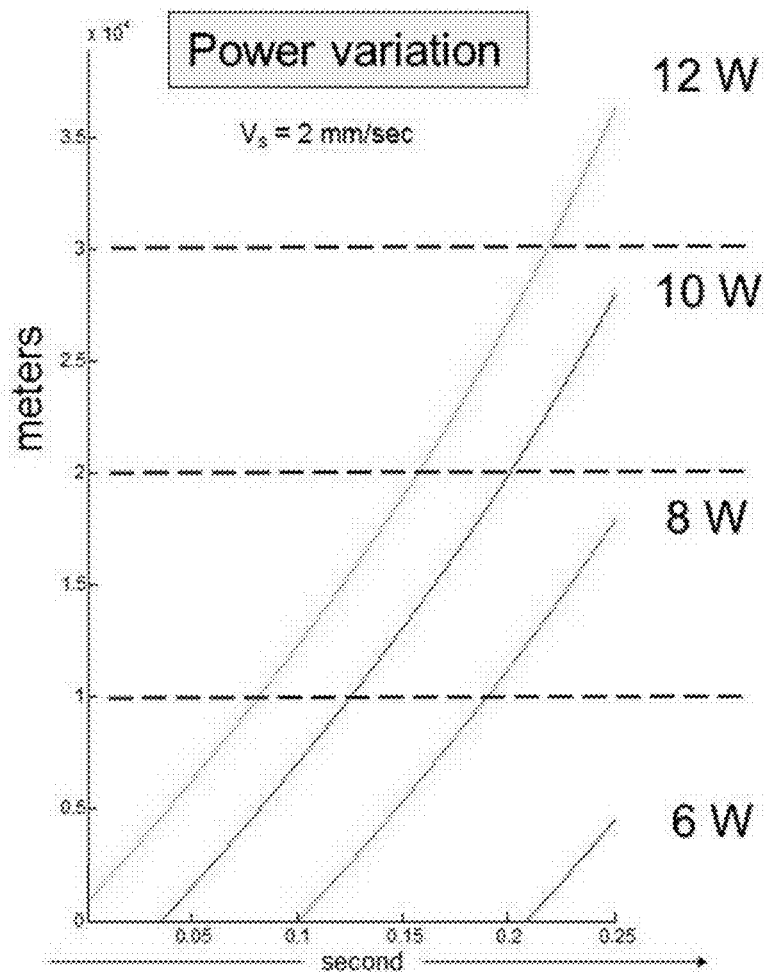
FIG. 30 is a plot providing stress location from an exemplary weld line.
Figure 31:
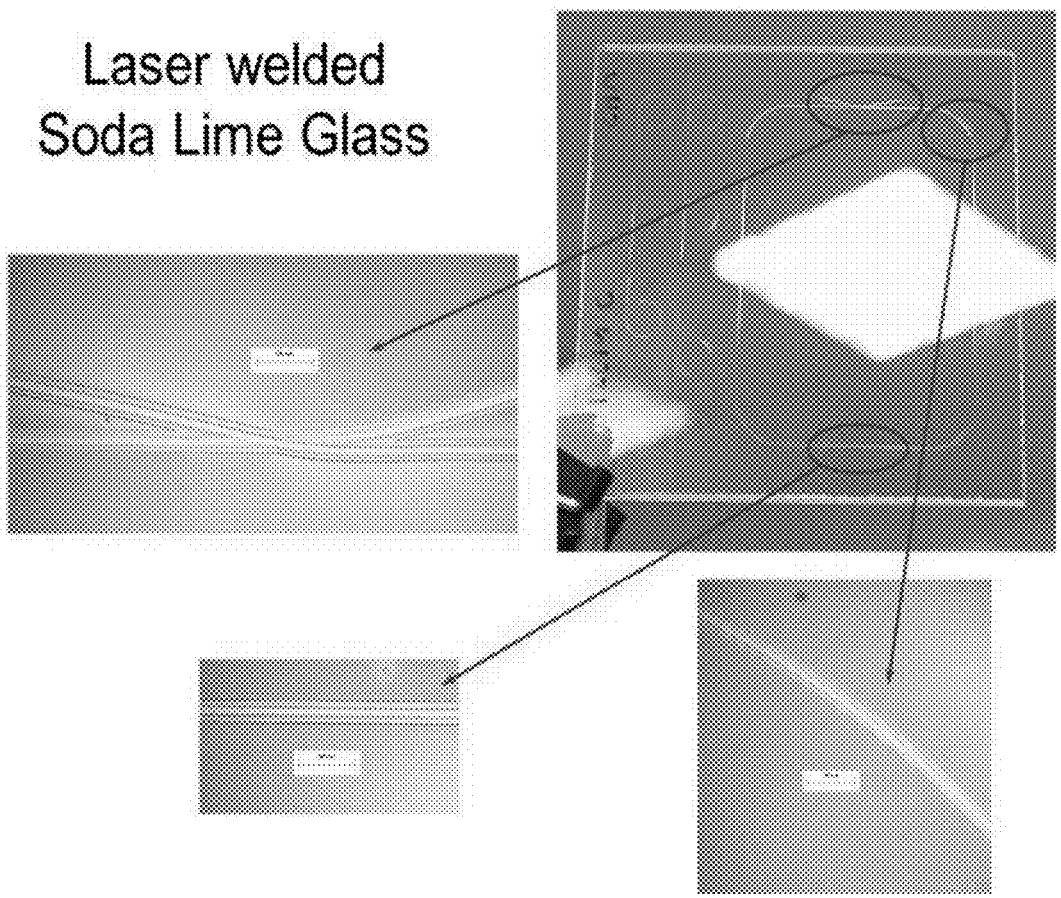
FIG. 31 is a series of photographs of laser welded soda lime glass according to some embodiments.

Power dependence is illustrated in FIG. 30 whereby it can be observed that simply increasing laser power during welding can induce greater stress beyond the interface region with excess energy resulting in a larger stress. FIG. 30 is a plot providing stress location from an exemplary weld line. With reference to FIG. 30, stress location from an exemplary weld line can be determined using Equation (6) where the parameters employed were similar to those used previously: wavelength=355 nm, beam waist=500 μm, repetition rate=30,000 Hz, pulse width=10 ns, $v_s$=2 mm/sec, dwell time=0.25 second, Eagle XG® thickness=0.7 mm, and Tstrain=669° C. FIG. 30 and Equation (6) also provide insight into why higher strain point glass substrates can result in higher stress profiles. For example, the stress profile location Z scales as the square root of the $\Delta T_m$ term which is linearly related to $T_{strain}$. Other attempts to predict experimental observations from these expressions can be limited not only by the assumptions used but also by the information that can be calculated, e.g., where higher CTE materials are laser welded. Here it was discovered that low CTE glass substrates (less than about 5 ppm/° C.) were more easily welded than higher CTE glasses such as soda-lime glasses. These low CTE substrates included quartz, fused silica, Eagle XG®, Willow, and Lotus glass substrates. After significant experimentation, suitable conditions were discovered making high quality welds in higher CTE glasses possible. For example, it was discovered that embodiments described herein can be used to weld soda lime glass (CTEs of about 9 ppm/° C. or greater) using 1 μm LMG films without any pre-heating requirement of the substrates, much less to the strain or annealing point. FIG. 31 is a series of photographs of laser welded soda lime glass according to some embodiments. With reference to FIG. 31, a high quality bond formation was achieved using very low laser power and a nanosecond pulse-width UV (355 nm) laser. The laser weld conditions used for these non-limiting and illustrated welds included a pulse width=1 ns, repetition rate=5 MHz, power=1 Watt, an approximately 20 μm beam spot resulting in 67 μm weld line, and $v_s$=50 mm/s. With continued reference to FIG. 31, a pulsed, 355-nm laser was used to weld two 0.7 mm thick soda lime glass plates compressed together with one substrate having a sputtered 1 μm thick low melting glass film. The aforementioned example and experiment should not limit the scope of the claims appended herewith as ranges of 2 MHz and 5 MHz laser repetition rates with 1 ns pulse widths were explored at laser beam translation rates from 50 mm/s-400 mm/sec. Further, laser beam spots of approximately 20 μm-70 μm at the low melting glass film interface were also explored for exemplary welds. In some embodiments, an exemplary weld line quality can be observed with a focal spot size of about 20 μm and a 50 mm/s translation rate. The robustness of these welded substrates was also noted after subjecting them to 100° C. for 4 hours without any crack formation.

Figure 32:
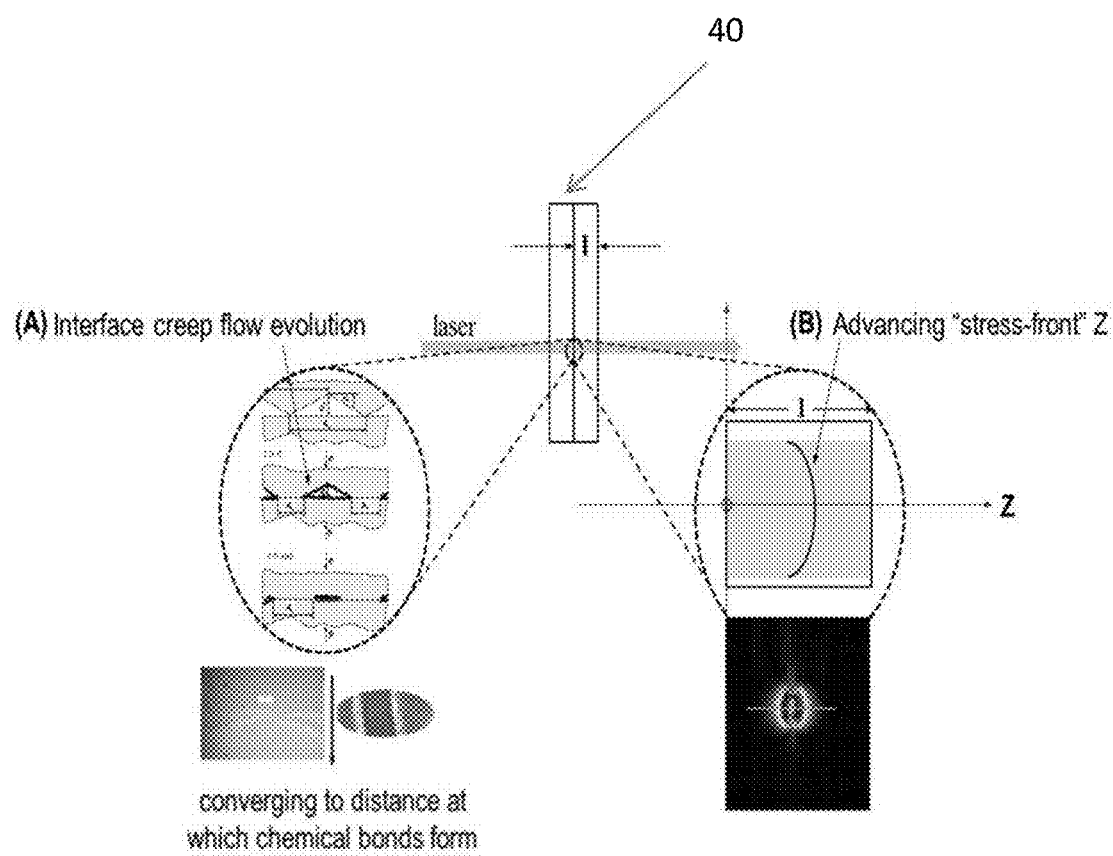
FIG. 32 is a schematic illustration of some embodiments.

FIG. 32 is a schematic illustration of some embodiments. With reference to FIG. 32, an exemplary, non-limiting process of achieving laser welding with absorbing thin films is illustrated where laser-thermal energy can be delivered into a substrate/substrate interface 40 to obtain a diffusion bond relative contact area, as close to unity, in a predetermined time, while minimizing any collateral damage, e.g., spatial extent and magnitude of tensile stress residue. This process can be more pronounced for higher CTE substrates where the weld-interface formation rate is faster than the creation of the CTE-mismatch stress interface. Thus, in some embodiments, a focused beam can be used at the weld interface along with higher velocity sweep rates to achieve an exemplary weld without any crack formation.

In some embodiments, laser welds can be achieved using a film that absorbs at an incident laser wavelength λ, preferably A %>about 20%. In other embodiments, both the substrate and film can exhibit color center formation at λ. In additional embodiments, a temperature effect can be employed to increase absorption for either or both the film and substrate at λ. Such an exemplary temperature effect can also contribute to the improvement of seal or weld speed and can lower the heat affected zone (HAZ) and can lower activation energy for creep flow, e.g., forms an eutectic system, an alloy, etc. In some embodiments, if transparency is required, then a band gap may be provided in UV, or high absorption in MR, IR. Additional embodiments can provide a weld having an interfacial surface energy $\gamma_{weld-interface}$>>residual $\gamma_{stress}$ field and/or a total integrated bond strength $\iint \gamma_{weld\text{-}interface} \partial A \gg \iint \gamma_{stress\text{-}field} \partial A$. Further embodiments can include a low laser intensity requirement whereby the laser peak photon flux is less than about $10^{25}$ photons/sec/cm$^2$ and does not include multiphoton behavior, ablation, or plasma generation.

While some embodiments have been described as utilizing low melting glass or inorganic films, the claims appended herewith should not be so limited as embodiments can use UV absorbing films, IRA films, and/or other inorganic films situated between two substrates. As noted above, in some embodiments, color center formation in an exemplary substrate glass is not necessary and is a function of the UV absorption of the film, e.g., less than about 20%. It follows that, in other embodiments, if the UV absorption of the film is greater than about 20%, alternative substrates such as quartz, low CTE substrates, and the like, can readily form welds. Furthermore, when high CTE substrates are used, these substrates can be readily welded with exemplary high repetition rate lasers (e.g., greater than about 300 kHz to about 5 MHz) and/or a low peak power. Furthermore, in embodiments where absorption of the film is a contributing factor, IR absorbing (visible transparent films) can be welded with the use of an exemplary IR laser system.

In various embodiments of the present disclosure, the glass sealing materials and resulting layers can be transparent and/or translucent, thin, impermeable, "green," and configured to form hermetic seals at low temperatures and with sufficient seal strength to accommodate large differences in CTE between the sealing material and the adjacent substrates. In some embodiments, the sealing layers can be free of fillers and/or binders. The inorganic materials used to form the sealing layer(s) can be non-frit-based or powders formed from ground glasses in some embodiments (e.g., UVA, LMG, etc.). In other embodiments, the sealing layer material is a low $T_g$ glass that has a substantial optical absorption cross-section at a predetermined wavelength which matches or substantially matches the operating wavelength of a laser used in the sealing process. In additional embodiments, absorption at room temperature of a laser processing wavelength by the low $T_g$ glass layer is at least 15%.

In general, suitable sealant materials include low $T_g$ glasses and suitably reactive oxides of copper or tin. The glass sealing material can be formed from low $T_g$ materials such as phosphate glasses, borate glasses, tellurite glasses and chalcogenide glasses. As defined herein, a low $T_g$ glass material has a glass transition temperature of less than 400° C., e.g., less than 350, 300, 250 or 200° C. Exemplary borate and phosphate glasses include tin phosphates, tin fluorophosphates and tin fluoroborates. Sputtering targets can include such glass materials or, alternatively, precursors thereof. Exemplary copper and tin oxides are CuO and SnO, which can be formed from sputtering targets comprising pressed powders of these materials. Optionally, the glass sealing compositions can include one or more dopants, including but not limited to tungsten, cerium and niobium. Such dopants, if included, can affect, for example, the optical properties of the glass layer, and can be used to control the absorption by the glass layer of laser radiation. For instance, doping with ceria can increase the absorption by a low $T_g$ glass barrier at laser processing wavelengths. Additional suitable sealant materials include laser absorbing low liquidus temperature (LLT) materials with a liquidus temperature less than or equal to about 1000° C., less than or equal to about 600° C., or less than or equal to about 400° C. In other embodiments, the composition of the inorganic film can be selected to lower the activation energy for inducing creep flow of the first substrate, the second substrate, or both the first and second substrates as described above.

Exemplary tin fluorophosphate glass compositions can be expressed in terms of the respective compositions of SnO, SnF$_2$ and P$_2$O$_5$ in a corresponding ternary phase diagram. Suitable UVA glass films can include SnO$_2$, ZnO, TiO$_2$, ITO, and other low melting glass compositions. Suitable tin fluorophosphates glasses include 20-100 mol % SnO, 0-50 mol % SnF$_2$ and 0-30 mol % P$_2$O$_5$. These tin fluorophosphates glass compositions can optionally include 0-10 mol % WO$_3$, 0-10 mol % CeO$_2$ and/or 0-5 mol % Nb$_2$O$_5$. For example, a composition of a doped tin fluorophosphate starting material suitable for forming a glass sealing layer comprises 35 to 50 mole percent SnO, 30 to 40 mole percent SnF$_2$, 15 to 25 mole percent P$_2$O$_5$, and 1.5 to 3 mole percent of a dopant oxide such as WO$_3$, CeO$_2$ and/or Nb$_2$O$_5$. A tin fluorophosphate glass composition according to one particular embodiment can be a niobium-doped tin oxide/tin fluorophosphate/phosphorus pentoxide glass comprising about 38.7 mol % SnO, 39.6 mol % SnF$_2$, 19.9 mol % P$_2$O$_5$ and 1.8 mol % Nb$_2$O$_5$. Sputtering targets that can be used to form such a glass layer may include, expressed in terms of atomic mole percent, 23.04% Sn, 15.36% F, 12.16% P, 48.38% O and 1.06% Nb.

A tin phosphate glass composition according to another embodiment comprises about 27% Sn, 13% P and 60% O, which can be derived from a sputtering target comprising, in atomic mole percent, about 27% Sn, 13% P and 60% O. As will be appreciated, the various glass compositions disclosed herein may refer to the composition of the deposited layer or to the composition of the source sputtering target. As with the tin fluorophosphates glass compositions, example tin fluoroborate glass compositions can be expressed in terms of the respective ternary phase diagram compositions of SnO, SnF$_2$ and B$_2$O$_3$. Suitable tin fluoroborate glass compositions include 20-100 mol % SnO, 0-50 mol % SnF$_2$ and 0-30 mol % B$_2$O$_3$. These tin fluoroborate glass compositions can optionally include 0-10 mol % WO$_3$, 0-10 mol % CeO$_2$ and/or 0-5 mol % Nb$_2$O$_5$. Additional aspects of suitable low $T_g$ glass compositions and methods used to form glass sealing layers from these materials are disclosed in commonly-assigned U.S. Pat. No. 5,089,446 and U.S. patent application Ser. Nos. 11/207,691, 11/544,262, 11/820,855, 12/072,784, 12/362,063, 12/763,541, 12/879,578, and 13/841,391 the entire contents of which are incorporated by reference herein.

Exemplary substrates (glass or otherwise) can have any suitable dimensions. Substrates can have areal (length and width) dimensions that independently range from 1 cm to 5 m (e.g., 0.1, 1, 2, 3, 4 or 5 m) and a thickness dimension that can range from about 0.5 mm to 2 mm (e.g., 0.5, 0.6, 0.7, 0.8, 0.9, 1.0, 1.2, 1.5 or 2 mm). In further embodiments, a substrate thickness can range from about 0.05 mm to 0.5 mm (e.g., 0.05, 0.1, 0.2, 0.3, 0.4 or 0.5 mm). In still further embodiments, a glass substrate thickness can range from about 2 mm to 10 mm (e.g., 2, 3, 4, 5, 6, 7, 8, 9 or 10 mm). A total thickness of an exemplary glass sealing layer can range from about 100 nm to 10 microns. In various embodiments, a thickness of the layer can be less than 10 microns, e.g., less than 10, 5, 2, 1, 0.5 or 0.2 microns. Exemplary glass sealing layer thicknesses include 0.1, 0.2, 0.5, 1, 2, 5 or 10 microns. The width of the sealed region, which can be proportional to the laser spot size, can be about 0.05 to 2 mm, e.g., 0.05, 0.1, 0.2, 0.5, 1, 1.5 or 2 mm. A translation rate of the laser (i.e., sealing rate) can range from about 1 mm/sec to 1000 mm/sec, such as 1, 2, 5, 10, 20, 50, 100, 200, 400, or 1000 mm/sec. The laser spot size (diameter) can be about 0.02 to 1 mm.

Thus, it has been discovered that suitable laser welding glass substrate interfaces can occur in embodiments of the present disclosure when the local glass temperature exceeds its strain or annealing temperature (e.g., 669° C. and 772° C. respectively for EXG) within a spatial extent, e.g., the "welding volume". This volume can be dependent upon the incident laser power, the composition of the UVA or LMG melt, and color center formation (as a result of impurities in the respective substrates). Once attained, the volume can be swept over the interfacial regions to result in a rapid and strong seal between two substrates (glass or otherwise). Sealing speeds in excess of 5-1000 mm/s can be attained. Exemplary laser welds can experience an abrupt transition to relatively cold ambient temperatures from the high temperatures associated with the melt volume as it is swept away over the substrate regions of interest. The integrity of the hermetic seal and its respective strength can be maintained by slow cooling (self-annealing) of the hot base glass color center (relaxation) regions and the thinness of the UVA or LMG or NIR thin film region (typically ½-1 µm) thereby nullifying any impact of CTE mismatching between the two respective substrates (glass or otherwise).

According to embodiments, the choice of the sealing layer material and the processing conditions for forming a sealing layer over a glass substrate are sufficiently flexible that the substrate is not adversely affected by formation of the glass layer. Low melting temperature glasses can be used to seal or bond different types of substrates. Sealable and/or bondable substrates include glasses, glass-glass laminates, glass-polymer laminates, glass-ceramics or ceramics, including gallium nitride, quartz, silica, calcium fluoride, magnesium fluoride or sapphire substrates. Additional substrates can be, but are not limited to, metal substrates including tungsten, molybdenum, copper, or other types of suitable metal substrates. In some embodiments, one substrate can be a phosphor-containing glass plate, which can be used, for example, in the assembly of a light emitting device. A phosphor-containing glass plate, for example, comprising one or more of a metal sulfide, metal silicate, metal aluminate or other suitable phosphor, can be used as a wavelength-conversion plate in white LED lamps. White LED lamps typically include a blue LED chip that is formed using a group III nitride-based compound semiconductor for emitting blue light. White LED lamps can be used in lighting systems, or as backlights for liquid crystal displays, for example. The low melting temperature glasses and associate sealing method disclosed herein can be used to seal or encapsulate the LED chip.

Exemplary processes according to embodiments of the present disclosure can be made possible because of the base substrate (glass or otherwise) properties due to the ability of the substrate to form color centers with the prevailing laser illumination conditions and resulting temperature enhancement. In some embodiments, the color center formation can be reversible if transparent seals are desired. If the substrates have dissimilar thicknesses, then thermally conductive substrates can be employed in some embodiments to restore weld integrity.

Exemplary embodiments can thus utilize low melting temperature materials to laser-weld glass or other material substrates together with a low laser pulse peak-power to minimize creation of shock waves and to ensure no micro cracks appear which could compromise the tensile fracture strength. Exemplary embodiments can also provide diffusion welding without melt puddle propagation allowing an adequate lower temperature sealing process. Due to the thinness of the film region, embodiments of the present disclosure can nullify any impact of CTE mismatching between the two respective substrates and can be utilized to provide welding of similarly or dissimilarly dimensioned substrates. Further, in embodiments of the present disclosure no patterning of film is required for sealing as occurs in the case of frit or staining materials, and manufacturers therefore do not have to reveal their proprietary designs.

The present disclosure also teaches how low melting temperature materials can be used to laser weld glass packages together enabling long lived hermetic operation of passive and active devices sensitive to degradation by attack of oxygen and moisture. As noted above, embodiments described herein provide UVA, LMG or other seals that can be thermally activated after assembly of the bonding surfaces using laser absorption and can enjoy a higher manufacturing efficiency since the rate of sealing each working device can be determined by thermal activation and bond formation, rather than the rate one encapsulates a device by inline thin film deposition in a vacuum or inert gas assembly line. This can enable large sheet multiple device sealing with subsequent scoring into individual devices (singulation), and due to high mechanical integrity the yield from singulation can be high.

Embodiments of the present disclosure also provide a laser sealing process, e.g., laser welding, diffusing welding, etc., that relies upon color center formation within the glass substrates due to extrinsic color centers, e.g., impurities or dopants, or intrinsic color centers inherent to the glass, at an incident laser wavelength, combined with exemplary laser absorbing films. Some non-limiting examples of films include $SnO_2$, ZnO, $TiO_2$, ITO, and low melting glass films which can be employed at the interface of the glass substrates. Welds using these materials can provide visible transmission with sufficient UV absorption to initiate steady state gentle diffusion welding. These materials can also provide transparent laser welds having localized sealing temperatures suitable for diffusion welding. Such diffusion welding results in low power and temperature laser welding of the respective glass substrates and can produce superior transparent welds with efficient and fast welding speeds. Exemplary laser welding processes according to embodiments of the present disclosure can also rely upon photo-induced absorption properties of glass beyond color center formation to include temperature induced absorption.

Hermetic encapsulation of a workpiece using the disclosed materials and methods can facilitate long-lived operation of devices otherwise sensitive to degradation by oxygen and/or moisture attack. Example workpieces, devices or applications include flexible, rigid or semi-rigid organic LEDs, OLED lighting, OLED televisions, photovoltaics, MEMs displays, electrochromic windows, fluorophores, alkali metal electrodes, transparent conducting oxides, quantum dots, etc.

As used herein, a hermetic layer is a layer which, for practical purposes, is considered substantially airtight and substantially impervious to moisture and/or oxygen. By way of example, the hermetic seal can be configured to limit the transpiration (diffusion) of oxygen to less than about $10^{-2}$ $cm^3/m^2/day$ (e.g., less than about $10^{-3}$ $cm^3/m^2/day$), and limit the transpiration (diffusion) of water to about $10^{-2}$ $g/m^2/day$ (e.g., less than about $10^{-3}$, $10^{-4}$, $10^{-5}$ or $10^{-6}$ $g/m^2/day$). In embodiments, the hermetic seal substantially inhibits air and water from contacting a protected workpiece.

In some embodiments, a method of bonding two substrates comprises forming a first glass layer on a sealing surface of a first substrate, forming a second glass layer on a sealing surface of a second substrate, placing at least a portion of the first glass layer in physical contact with at least a portion of the second glass layer, and heating the glass layers to locally melt the glass layers and the sealing surfaces to form a glass-to-glass weld between the first and second substrates. In each of the sealing architectures disclosed herein, sealing using a low melting temperature glass layer can be accomplished by the local heating, melting and then cooling of both the glass layer and the glass substrate material located proximate to the sealing interface.

It is thus an aspect of embodiments of the present disclosure to combine the ease of forming hermetic seals associated with laser welding to also form hermetic packages of active OLED or other devices to enable their widespread fabrication. Such fabrication would require welding over interfacial conductive films. Unlike the methods disclosed herein, conventional methods of laser sealing can sever such interfacial conducting leads would sever them especially if the interface temperature gets too high or there is deleterious laser radiation interaction with the conducting lead material. Embodiments of the present disclosure, however, provide an enabling disclosure of device structures requiring electrical biasing for hermetic device operation using interfacial low melting temperature glass material film. Embodiments of the present subject matter may thus provide a successful laser-welding of glass sheets or other substrates having an interfacial conductive film without destruction thereto or loss in performance.

In some embodiments, a method of bonding a workpiece comprises forming an inorganic film over a surface of a first substrate, arranging a workpiece to be protected between the first substrate and a second substrate wherein the film is in contact with the second substrate, and bonding the workpiece between the first and second substrates by locally heating the film with laser radiation having a predetermined wavelength. The inorganic film, the first substrate, or the second substrate can be transmissive at approximately 420 nm to approximately 750 nm. In another embodiment, each of the inorganic film, first substrate and second substrate are transmissive at approximately 420 nm to approximately 750 nm. In a further embodiment, absorption of the inorganic film is more than 10% at a predetermined laser wavelength. In an additional embodiment, the composition of the inorganic film can be, but is not limited to, $SnO_2$, $ZnO$, $TiO_2$, ITO, Zn, Ti, Ce, Pb, Fe, Va, Cr, Mn, Mg, Ge, $SnF_2$, $ZnF_2$ and combinations thereof. In other embodiments, the composition of the inorganic film can be selected to lower the activation energy for inducing creep flow of the first substrate, the second substrate, or both the first and second substrates. In another embodiment, the composition of the inorganic film can be a laser absorbing low liquidus temperature material with a liquidus temperature less than or equal to about 1000° C., less than or equal to about 600° C., or less than or equal to about 400° C. In further embodiments, the step of bonding can create a bond having an integrated bond strength greater than an integrated bond strength of a residual stress field in the first substrate, second substrate or both the first and second substrates. In some exemplary embodiments, such a bond will fail only by cohesive failure. In a further embodiment, the composition of the inorganic film comprises 20-100 mol % SnO, 0-50 mol % $SnF_2$, and 0-30 mol % $P_2O_5$ or $B_2O_3$. In some embodiments, the inorganic film and the first and second substrates have a combined internal transmission of more than 80% at approximately 420 nm to approximately 750 nm. In other embodiments, the step of bonding further comprises bonding the workpiece between the first and second substrates as a function of the composition of impurities in the first or second substrates and as a function of the composition of the inorganic film though the local heating of the inorganic film with laser radiation having a predetermined wavelength. Exemplary impurities in the first or second substrates can be, but are not limited to, As, Fe, Ga, K, Mn, Na, P, Sb, Ti, Zn, Sn and combinations thereof. In further embodiments, the first and second substrates have different lateral dimensions, different CTEs, different thicknesses, or combinations thereof. In some embodiments, one of the first and second substrates can be glass or glass-ceramic. Of course, the other of the first and second substrates can be a glass-ceramic, ceramic or metal. In some embodiments, the method can also include the step of annealing the bonded workpiece. In other embodiments, the laser radiation comprises UV radiation at a predetermined wavelength between approximately 193 nm to approximately 420 nm, NIR radiation at a predetermined wavelength between approximately 780 nm to approximately 5000 nm, can include a pulse-width from 1 to 40 nanoseconds and a repetition rate of at least 1 kHz, and/or can be continuous wave. In further embodiments, a thickness of the inorganic film ranges from about 10 nm to 100 micrometers. In some embodiments, the first, second or first and second substrates can comprise an alkaline earth boro-aluminosilicate glass, thermally strengthened glass, chemically strengthened glass, boro-silicate glass, alkali-aluminosilicate glass, soda-lime glass, and combinations thereof. In other embodiments, the method can include the step of moving a laser spot formed by the laser radiation at a speed of approximately 1 mm/s to approximately 1000 mm/s to create a minimal heating zone. This speed, in some embodiments, does not exceed the product of a diameter of the laser spot and a repetition rate of the laser radiation. In further embodiments, the step of bonding can create a bond line having a width of approximately 50 μm to approximately 1000 μm. In other embodiments, the inorganic film, first substrate, or second substrate can be optically transparent before and after the step of bonding in a range of greater than 80%, between 80% to 90%, greater than 85%, or greater than 90% at about 420 nm to about 750 nm. An exemplary workpiece can be, but is not limited to, a light emitting diode, an organic light emitting diode, a conductive lead, a semiconductor chip, an ITO lead, a patterned electrode, a continuous electrode, quantum dot materials, phosphor, and combinations thereof.

In other embodiments, a bonded device is provided comprising an inorganic film formed over a surface of a first substrate, and a device protected between the first substrate and a second substrate wherein the inorganic film is in contact with the second substrate. In such an embodiment, the device includes a bond formed between the first and second substrates as a function of the composition of impurities in the first or second substrates and as a function of the composition of the inorganic film though a local heating of the inorganic film with laser radiation having a predetermined wavelength. Further, the inorganic film, the first substrate, or the second substrate can be transmissive at approximately 420 nm to approximately 750 nm. In another embodiment, each of the inorganic film, first substrate and second substrate are transmissive at approximately 420 nm to approximately 750 nm. In a further embodiment, absorption of the inorganic film is more than 10% at a predetermined laser wavelength. In an additional embodiment, the composition of the inorganic film can be, but is not limited to, $SnO_2$, ZnO, $TiO_2$, ITO, Zn, Ti, Ce, Pb, Fe, Va, Cr, Mn, Mg, Ge, $SnF_2$, $ZnF_2$ and combinations thereof. In other embodiments, the composition of the inorganic film can be selected to lower the activation energy for inducing creep flow of the first substrate, the second substrate, or both the first and second substrates. In another embodiment, the composition of the inorganic film can be a laser absorbing low liquidus temperature material with a liquidus temperature less than or equal to about 1000° C., less than or equal to about 600° C., or less than or equal to about 400° C. In further embodiments, the bond can have an integrated bond strength greater than an integrated bond strength of a residual stress field in the first substrate, second substrate or both the first and second substrates. In some exemplary embodiments, such a bond will fail only by cohesive failure. In a further embodiment, the composition of the inorganic film comprises 20-100 mol % SnO, 0-50 mol % $SnF_2$, and 0-30 mol % $P_2O_5$ or $B_2O_3$. In some embodiments, the inorganic film and the first and second substrates have a combined internal transmission of more than 80% at approximately 420 nm to approximately 750 nm. Exemplary impurities in the first or second substrates can be, but are not limited to, As, Fe, Ga, K, Mn, Na, P, Sb, Ti, Zn, Sn and combinations thereof. In further embodiments, the first and second substrates have different lateral dimensions, different CTEs, different thicknesses, or combinations thereof. In some embodiments, one of the first and second substrates can be glass or glass-ceramic. Of course, the other of the first and second substrates can be a glass-ceramic, ceramic or metal. In further embodiments, a thickness of the inorganic film ranges from about 10 nm to 100 micrometers. In some embodiments, the first, second or first and second substrates can comprise an alkaline earth boro-aluminosilicate glass, alkali-aluminosilicate glass, thermally strengthened glass, chemically strengthened glass, soda-lime glass, boro-silicate glass and combinations thereof. In other embodiments, the inorganic film, first substrate, or second substrate can be optically transparent before and after the step of bonding in a range of greater than 80%, between 80% to 90%, greater than 85%, or greater than 90% at about 420 nm to about 750 nm. An exemplary device can be, but is not limited to, a light emitting diode, an organic light emitting diode, a conductive lead, a semiconductor chip, an ITO lead, a patterned electrode, a continuous electrode, quantum dot materials, phosphor, and combinations thereof. In some embodiments, the bond can be hermetic with a closed loop or with seal lines crossing at angles greater than about 1 degree, can include spatially separated bond spots, and/or can be located at less than about 1000 μm from heat sensitive material of the bond. In other embodiments, birefringence around the bond can be patterned.

In further embodiments, a method of protecting a device is provided comprising forming an inorganic film layer over a first portion surface of a first substrate, arranging a device to be protected between the first substrate and a second substrate wherein the sealing layer is in contact with the second substrate, and locally heating the inorganic film layer and the first and second substrates with laser radiation to melt the sealing layer and the substrates to form a seal between the substrates. The first substrate can be comprised of glass or glass-ceramics, and the second substrate can be comprised of metal, glass-ceramics or ceramic. In some embodiments, the first and second substrates have different lateral dimensions, different CTEs, different thicknesses, or combinations thereof. In other embodiments, the device can be, but is not limited to, an ITO lead, a patterned electrode, and a continuous electrode. In some embodiments, the step of locally heating further comprises adjusting power of the laser radiation to reduce damage to the formed seal. An exemplary film can be, but is not limited to, a low $T_g$ glass, which comprises 20-100 mol % SnO, 0-50 mol % $SnF_2$, and 0-30 mol % $P_2O_5$ or $B_2O_3$. In other embodiments, the composition of the inorganic film can be selected to lower the activation energy for inducing creep flow of the first substrate, the second substrate, or both the first and second substrates. In another embodiment, the composition of the inorganic film can be a laser absorbing low liquidus temperature material with a liquidus temperature less than or equal to about 1000° C., less than or equal to about 600° C., or less than or equal to about 400° C. In further embodiments, the step of bonding can create a bond having an integrated bond strength greater than an integrated bond strength of a residual stress field in the first substrate, second substrate or both the first and second substrates. In some exemplary embodiments, such a bond will fail only by cohesive failure.

While this description can include many specifics, these should not be construed as limitations on the scope thereof, but rather as descriptions of features that can be specific to particular embodiments. Certain features that have been heretofore described in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and can even be initially claimed as such, one or more features from a claimed combination can in some cases be excised from the combination, and the claimed combination can be directed to a subcombination or variation of a subcombination.

Similarly, while operations are depicted in the drawings or figures in a particular order, this should not be understood as requiring that such operations be performed in the particular order shown or in sequential order, or that all illustrated operations be performed, to achieve desirable results. In certain circumstances, multitasking and parallel processing can be advantageous.

As shown by the various configurations and embodiments illustrated in FIGS. 1-34, various embodiments for laser sealing using low melting glass or thin absorbing films have been described.

While preferred embodiments of the present disclosure have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A bonding method comprising:
    forming an inorganic film over a surface of a first substrate;
    positioning a second substrate in contact with the inorganic film; and
    bonding the first and second substrates by locally heating the inorganic film with laser radiation having a predetermined wavelength;
    wherein at least one of the first and second substrates includes impurities causing the at least one substrate to develop color centers in response to the laser radiation of the predetermined wavelength such that the bonding occurs as a function of a composition of the impurities in the at least one substrate and as a function of a composition of the inorganic film.

2. The method of claim 1, wherein at least one of the inorganic film, the first substrate, and the second substrate are transmissive at wavelengths ranging from about 420 m to about 750 nm.

3. The method of claim 1, further comprising arranging workpiece between the first and second substrates prior to locally heating the inorganic film with laser radiation.

4. The method of claim 1, further comprising forming a second inorganic film over a surface of the second substrate.

5. The method of claim 1, wherein the composition of the inorganic film is selected from the group consisting of $SnO_2$, ZnO, $TiO_2$, ITO, Zn, Ti, Ce, Pb, Fe, Va, Cr, Mn, Mg, Ge, $SnF_2$, $ZnF_2$, and combinations thereof.

6. The method of claim 1, wherein the composition of the inorganic film comprises:
20-100 mol % SnO;
0-50 mol % $SnF_2$; and
0-30 mol % $P_2O_5$ or $B_2O_3$.

7. The method of claim 1, wherein the impurities in the first or second substrates are selected from the group consisting of As, Fe, Ga, K, Mn, Na, P, Sb, Ti, Zn, Sn, and combinations thereof.

8. The method of claim 1, wherein at least one of the first and second substrates comprises a glass, glass-ceramic, ceramic, polymer, or metal.

9. The method of claim 1, wherein the laser radiation comprises UV radiation at a predetermined wavelength from about 193 nm to about 420 nm or NIR radiation at a predetermined wavelength from about 780 nm to about 5000 nm.

10. A sealed device comprising:
an inorganic film formed over a surface of a first substrate;
a second substrate in contact with the inorganic film; and
a bond formed between the first and second substrates as a function of a composition of impurities in at least one of the first and second substrates, and as a function of a composition of the inorganic film through local heating of the inorganic film with laser radiation having a predetermined wavelength;
wherein the at least one substrate comprises color centers developed in response to the laser radiation of the predetermined wavelength interacting with the impurities.

11. The sealed device of claim 10, wherein at least one of the inorganic film, the first substrate, and the second substrate is transmissive at wavelengths ranging from about 420 nm to about 750 nm.

12. The sealed device of claim 10, wherein at least one of the first and second substrates comprises a glass, glass-ceramic, ceramic, polymer, or metal.

13. The sealed device of claim 10, further comprising a second inorganic film formed over a surface of the second substrate.

14. The sealed device of claim 10, wherein the inorganic film has a thickness ranging from about 0.1 microns to about 10 microns.

15. The sealed device of claim 10, wherein the composition of the inorganic film is selected from the group consisting of $SnO_2$, ZnO, $TiO_2$, ITO, Zn, Ti, Ce, Pb, Fe, Va, Cr, Mn, Mg, Ge, $SnF_2$, $ZnF_2$, and combinations thereof.

16. The sealed device of claim 10, wherein the composition of the inorganic film comprises:
20-100 mol % SnO;
0-50 mol % $SnF_2$; and
0-30 mol % $P_2O_5$ or $B_2O_3$.

17. The method of claim 1, wherein development of the color centers in the at least one substrate occurs after the inorganic film begins to melt in response to the laser radiation.

18. The method of claim 1, wherein the developed color centers increase a rate at which the at least one substrate absorbs the laser radiation.

19. The method of claim 1, wherein the at least one substrate and the inorganic film develop color centers in response to the predetermined laser radiation wavelength.

20. A device created according to the method of claim 1.

* * * * *

UNITED STATES PATENT AND TRADEMARK OFFICE
CERTIFICATE OF CORRECTION

PATENT NO. : 10,283,731 B2
APPLICATION NO. : 15/699337
DATED : May 7, 2019
INVENTOR(S) : Leonard Charles Dabich, II et al.

Page 1 of 1

It is certified that error appears in the above-identified patent and that said Letters Patent is hereby corrected as shown below:

In the Claims

In Column 31, Line 39 (approx.), Claim 10, delete "substrates," and insert -- substrates --, therefor.

Signed and Sealed this
Tenth Day of December, 2019

Andrei Iancu
*Director of the United States Patent and Trademark Office*